(12) United States Patent
Noujeim

(10) Patent No.: US 6,985,820 B2
(45) Date of Patent: Jan. 10, 2006

(54) CONDUCTOR ARRANGEMENT FOR REDUCED NOISE DIFFERENTIAL SIGNALLING

(75) Inventor: Leesa M. Noujeim, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 42 days.

(21) Appl. No.: 10/804,447

(22) Filed: Mar. 19, 2004

(65) Prior Publication Data

US 2005/0210162 A1    Sep. 22, 2005

(51) Int. Cl.
*G01R 31/00* (2006.01)
*G01R 31/02* (2006.01)
(52) U.S. Cl. .......................... 702/57; 324/761
(58) Field of Classification Search ............ 702/57; 324/761, 763, 765, 628, 537, 754
See application file for complete search history.

(56) References Cited

U.S. PATENT DOCUMENTS

| | | | | |
|---|---|---|---|---|
| 5,065,090 A | * | 11/1991 | Gheewala | 714/32 |
| 5,486,766 A | * | 1/1996 | Hibdon et al. | 324/537 |
| 5,596,269 A | * | 1/1997 | Miller et al. | 324/73.1 |
| 6,100,815 A | * | 8/2000 | Pailthorp | 324/754 |
| 6,198,297 B1 | * | 3/2001 | Riccioni | 324/754 |
| 6,933,853 B2 | * | 8/2005 | Barr et al. | 340/653 |
| 2004/0249585 A1 | * | 12/2004 | Barr et al. | 702/57 |

* cited by examiner

*Primary Examiner*—Marc S. Hoff
*Assistant Examiner*—Paul Kim
(74) *Attorney, Agent, or Firm*—Hamilton & Terrile, LLP; Stephen A. Terrile

(57) ABSTRACT

A method for analyzing input output (I/O) pin arrangements to determine the effect of differential pair and power and ground pin placement on signal quality which includes constructing an array of pins, arranging a plurality of differential pairs within the array of pins to provide a pin arrangement, exciting each of the differential pairs within the pin arrangement, monitoring coupled noise on other differential pairs within the pin arrangement, and analyzing the pin arrangement based upon the monitoring.

18 Claims, 52 Drawing Sheets

CONDUCTOR ARRANGEMENT FOR REDUCED NOISE DIFFERENTIAL SIGNALLING

BACKGROUND OF THE INVENTION

1. Field of the Invention

The present invention relates to the field of input/output (I/O) pin arrangement, and more particularly, to analyzing I/O pin arrangements to determine the effect of differential pair and power and ground pin placement on signal quality.

2. Description of the Related Art

The noise coupling between signals in the transmission media between driver and receiver can limit one or more of the maximum bit-rate, transmission length and bit error rate. Differential signaling may help to reduce noise coupling, but primarily affects driver and receiver operation rather than transmission media. Noise coupling in the transmission media, especially in the vertical interconnect regions of the transmission media can be a limiting factor.

The vertical interconnect regions, generally referred to as pins, are also known as vias, sockets, connectors, balls and bumps. Noise coupling in the vertical interconnect regions can be a limiting factor in bus design.

Vertical interconnect regions perform a signal connect function for data, power and ground. The vertical interconnect region is perpendicular to traces and thus provides trace transitions from traces on a board, from a board to a package, from one board to another board or from a plane to another plane.

SUMMARY OF THE INVENTION

In accordance with the present invention, a system and method for analyzing I/O pin arrangements to determine the effect of differential pair and power and ground pin placement on signal quality is provided. Additionally, in accordance with another aspect of the present invention, a differential pair and power and ground signal assignment pattern for vertical interconnect that reduces the coupling between differential pairs within the vertical interconnect is provided.

In one embodiment, the invention relates to a method for analyzing input output (I/O) pin arrangements to determine the effect of differential pair and power and ground pin placement on signal quality which includes constructing an array of pins, arranging a plurality of differential pairs within the array of pins to provide a pin arrangement, exciting each of the differential pairs within the pin arrangement, monitoring coupled noise on other differential pairs within the pin arrangement, and analyzing the pin arrangement based upon the monitoring.

In another embodiment, the invention relates to an apparatus for analyzing input output (I/O) pin arrangements to determine the effect of differential pair and power and ground pin placement on signal quality which includes means for constructing an array of pins, means for arranging a plurality of differential pairs within the array of pins to provide a pin arrangement, means for exciting each of the differential pairs within the pin arrangement, means for monitoring coupled noise on other differential pairs within the pin arrangement, and means for analyzing the pin arrangement based upon the monitoring.

In another embodiment, the invention relates to an apparatus which includes a processor, a memory coupled to the processor, and a system for analyzing input output (I/O) pin arrangements to determine the effect of differential pair and power and ground pin placement on signal quality. The system is stored on the memory and executes on the processor. The system includes a constructing module, an arranging module, an exciting module, a monitoring module, and an analyzing module. The constructing module constructs an array of pins. The arranging module arranges a plurality of differential pairs within the array of pins to provide a pin arrangement. The exciting module excites each of the differential pairs within the pin arrangement. The monitoring module monitoring coupled noise on other differential pairs within the pin arrangement and the analyzing module analyzes the pin arrangement based upon the monitoring.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
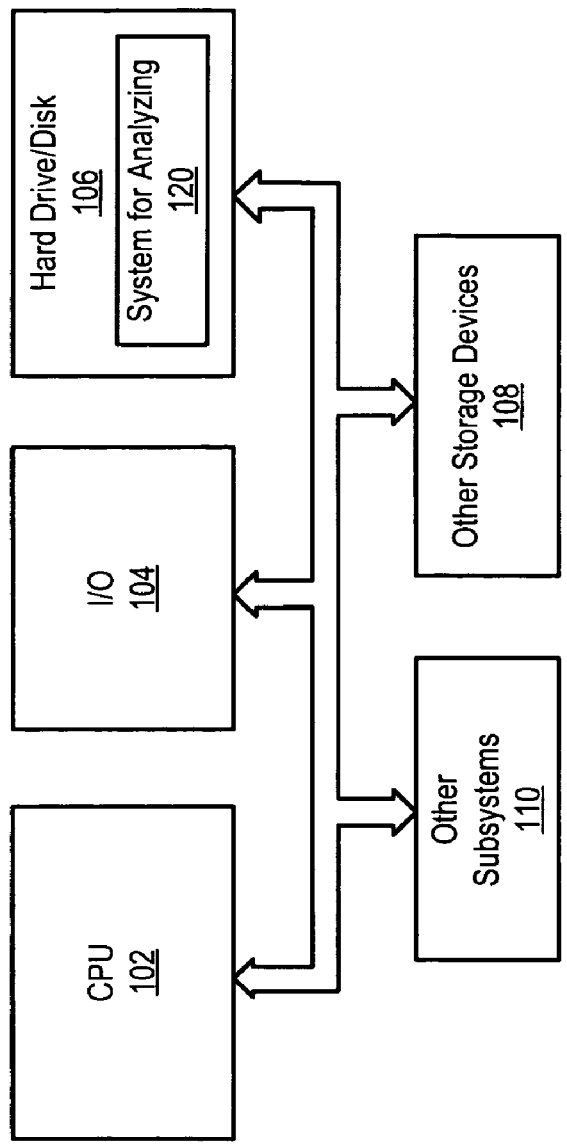
FIG. 1 shows a schematic block diagram of a system for analyzing I/O pin arrangements.

Referring to FIG. 1, a schematic block diagram of an information handling system 100 which includes a system for analyzing I/O pin arrangements is shown. The information handling system 100 includes a processor 102, input/output (I/O) devices 104, which as a display, a keyboard, a mouse, and associated controllers, a non-volatile memory 106 such as a hard disk drive, and other storage devices 108, such as a floppy disk and drive and other memory devices, and various other subsystems 110, all interconnected via one or more buses 112. The non-volatile memory 106 includes the system for analyzing I/O pin arrangements 120, which executes on processor 102.

Figure 2:
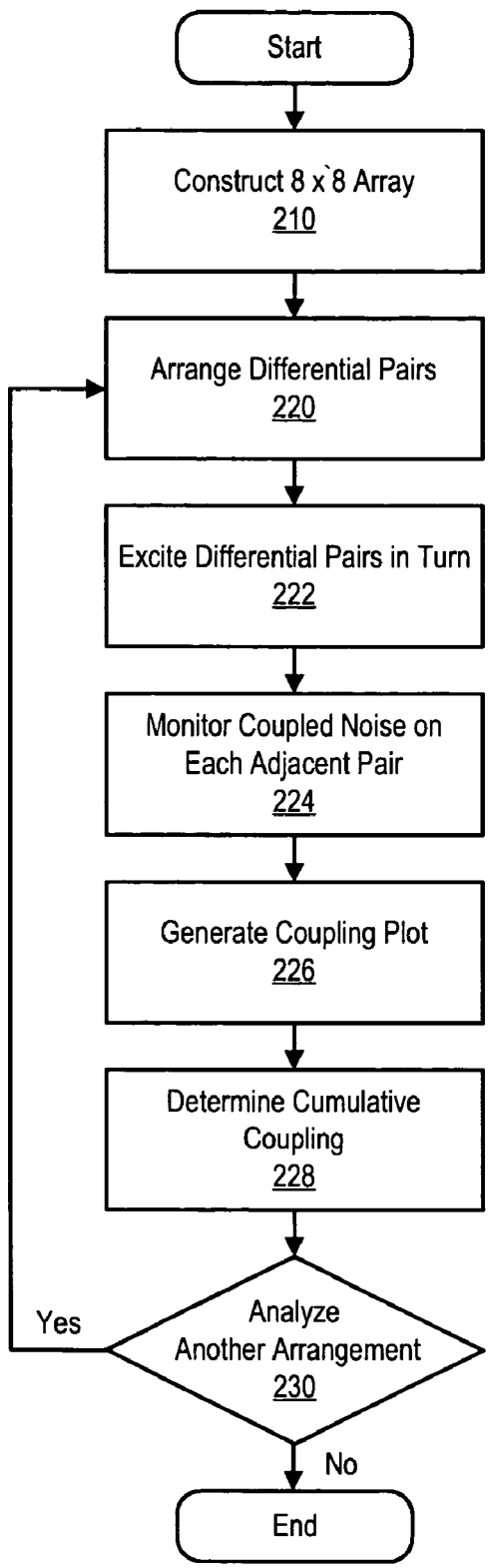
FIG. 2 shows a flow chart of the operation of a method for analyzing I/O pin arrangements to determine the effect of differential pair and power and ground pin placement on signal quality.

Referring to FIG. 2, a flow chart of the operation of the system 120 for analyzing I/O pin arrangements to determine the effect of differential pair and power and ground pin placement on signal quality is shown. More specifically, the system for analyzing I/O pin arrangements to determine the effect of differential pair and power and ground pin placement on signal quality starts operation by constructing a simulation of an exemplative 8×8 array of pins at step 210. In one embodiment, the pins are perfectly conducting cylinders on 1 mm pitch in a dielectric material with a relative permittivity of 4.

After the simulation is constructed within the system, the array is configured to represent a particular arrangement of differential pairs and power and ground pins at step 220. After the arrangement of pins is configured, then each differential pair is excited in turn at step 222. In one example, the differential pairs are excited with a 2 volt, 100 MHz ac source and all power and ground pins are locally tied together.

When a differential pair is excited, the coupled noise on each other pair within the array is monitored at step 224. Based upon the monitoring, a coupling plot is generated at step 226. Using the coupling plot, the cumulative coupling on the monitored pins is determined at step 228. After the cumulative coupling is determined at step 228, the system 120 determines whether to analyze another arrangement of differential pairs at step 230.

If the system is to analyze another arrangement of differential pairs, then the system returns to step 220 and the array is configured with another arrangement of differential pairs and power and ground pins. If the system determines not to analyze another arrangement of differential pairs, then the system 120 completes execution.

Referring generally to FIGS. 3–6, for an 8×8 array, a maximum of 32 differential pairs are possible within the array. Many arrangements do not fit perfectly within the 8×8 array, and thus some signal pins do not have a complete differential pair within the array (i.e., the pins are dangling). Accordingly, the cumulative coupled noise is expected to be best represented by the center region of the 8×8 array.

For the purposes of the system 120, certain arrangements may be more preferable to analyze than other arrangements. The arrangements may be characterized by a ratio of differential pairs to power and ground pins. In one embodiment, the analysis reviewed arrangements ranging from differential pairs having no corresponding power and ground pins to arrangements having one power and one ground pin for every four differential pairs.

Referring to FIGS. 3A–3D, a plurality of maximally packed pin arrangements are possible within the 8×8 array. A maximally packed pin arrangement is a pin arrangement in which each pin within the array is part of a differential pair or I/O pins. Within each 8×8 array, a differential pair is represented by a circle with a "+" sign and a circle with a "−" sign that are linked via an oval. Each pair is also labeled with a unique identifier.

Figure 3B:
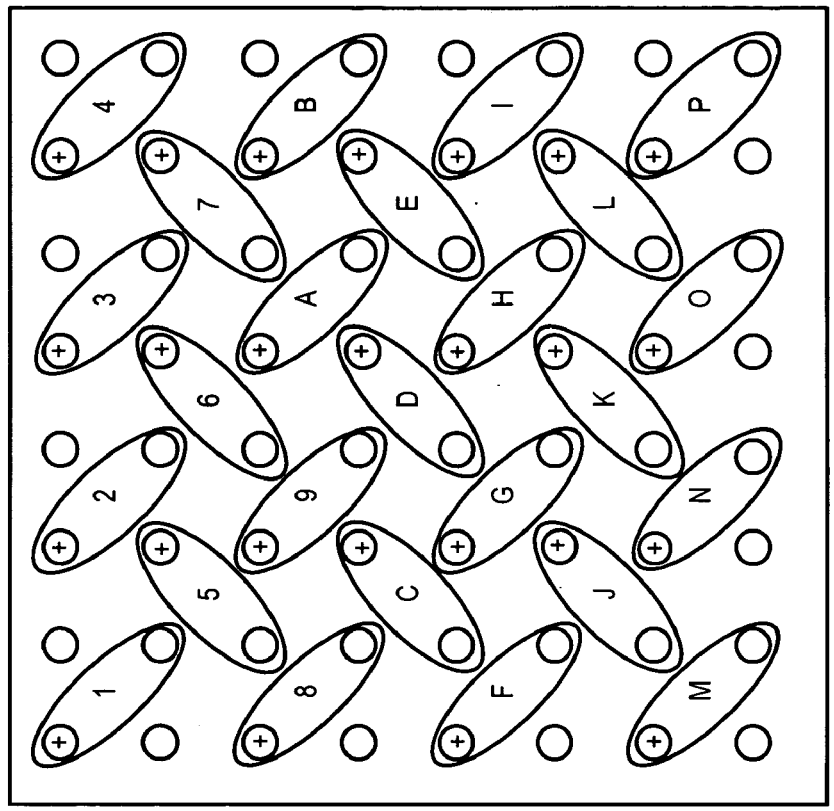
FIGS. 3A–3D, generally referred to as FIG. 3, show a plurality of examples of maximally packed pin arrangements within an 8×8 array.
Figure 3A:
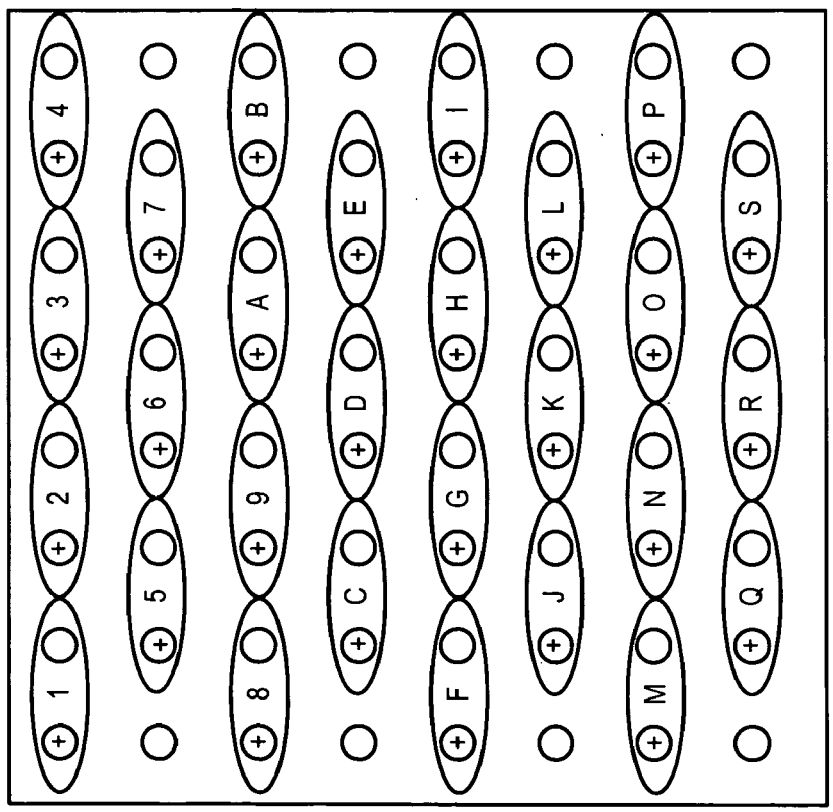

For example, FIG. 3A shows a straight maximally packed arrangement. In the straight maximally packed arrangement, the differential pairs are arranged in straight rows where the differential pairs are contiguous such that a "−" pin of a differential pair is next to a "+" of another differential pair.

FIG. 3B shows a diagonally packed arrangement.

Figure 3C:
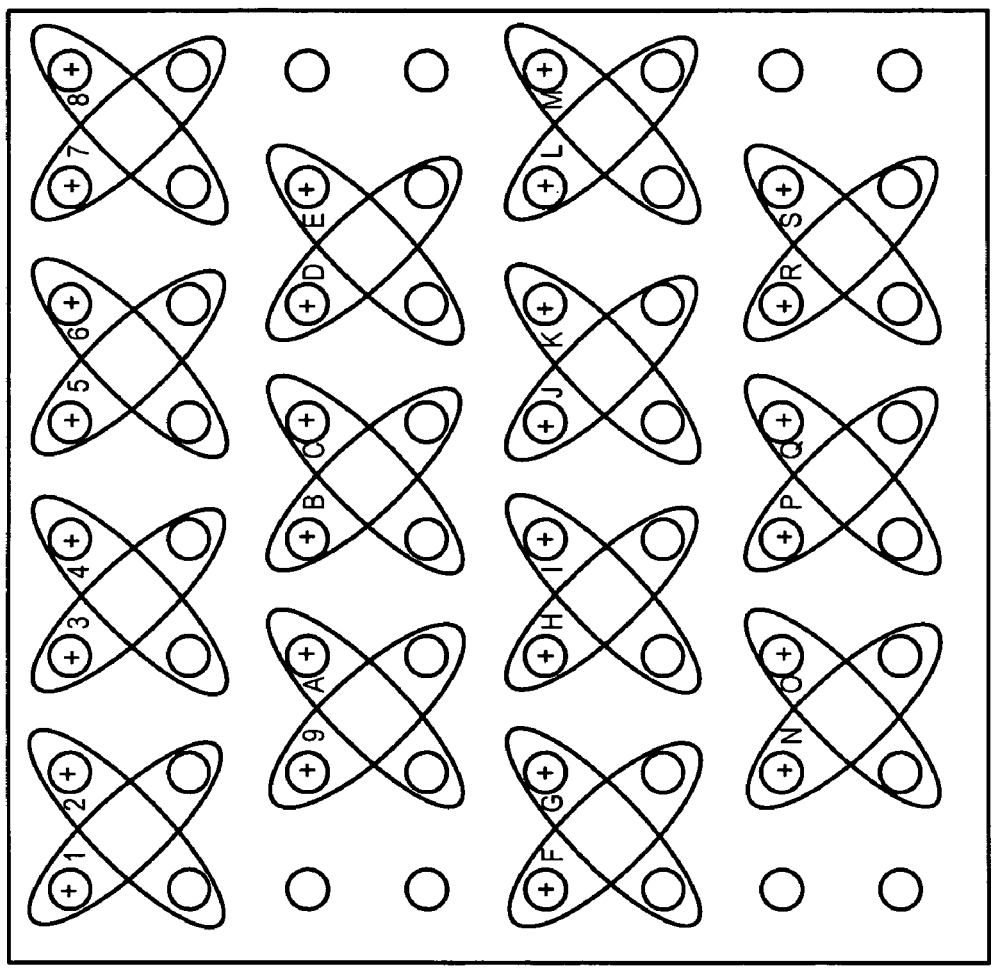

FIG. 3C shows a crossed maximally packed arrangement.

Figure 3D:
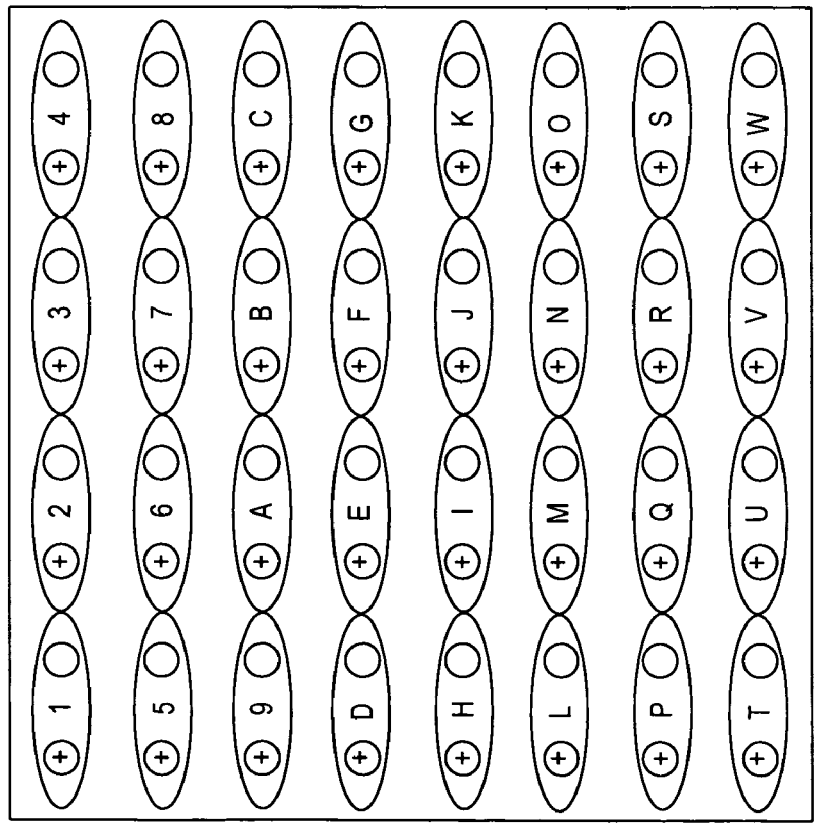

FIG. 3D shows an aligned maximally packed arrangement.

Figure 4A:
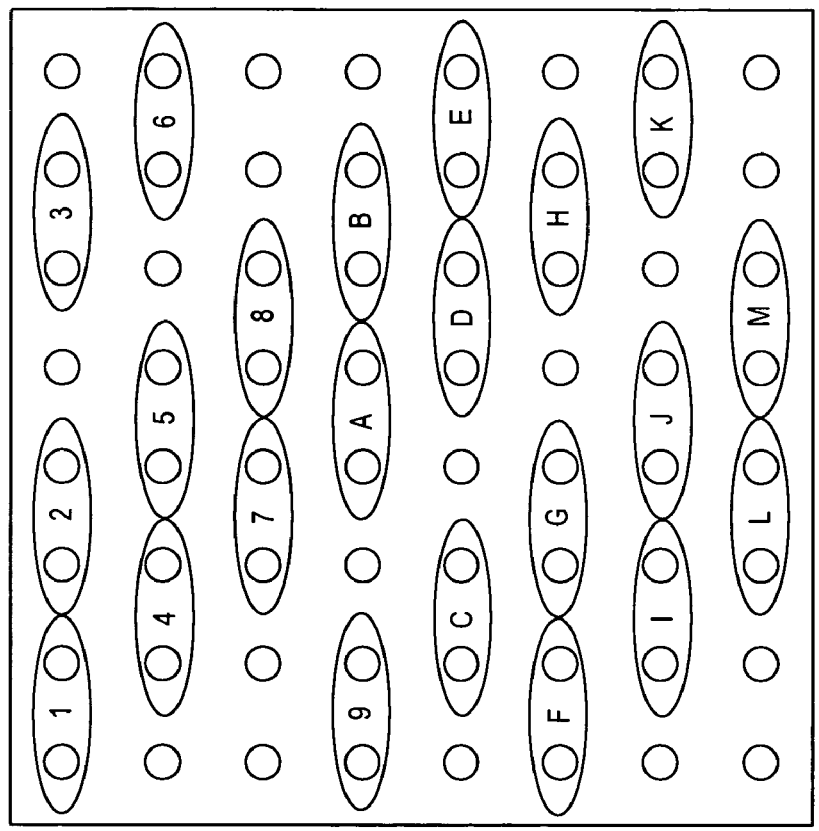
FIGS. 4A–4C, generally referred to as FIG. 4, show a plurality of examples of pin arrangements within an 8×8 array.
Figure 4B:
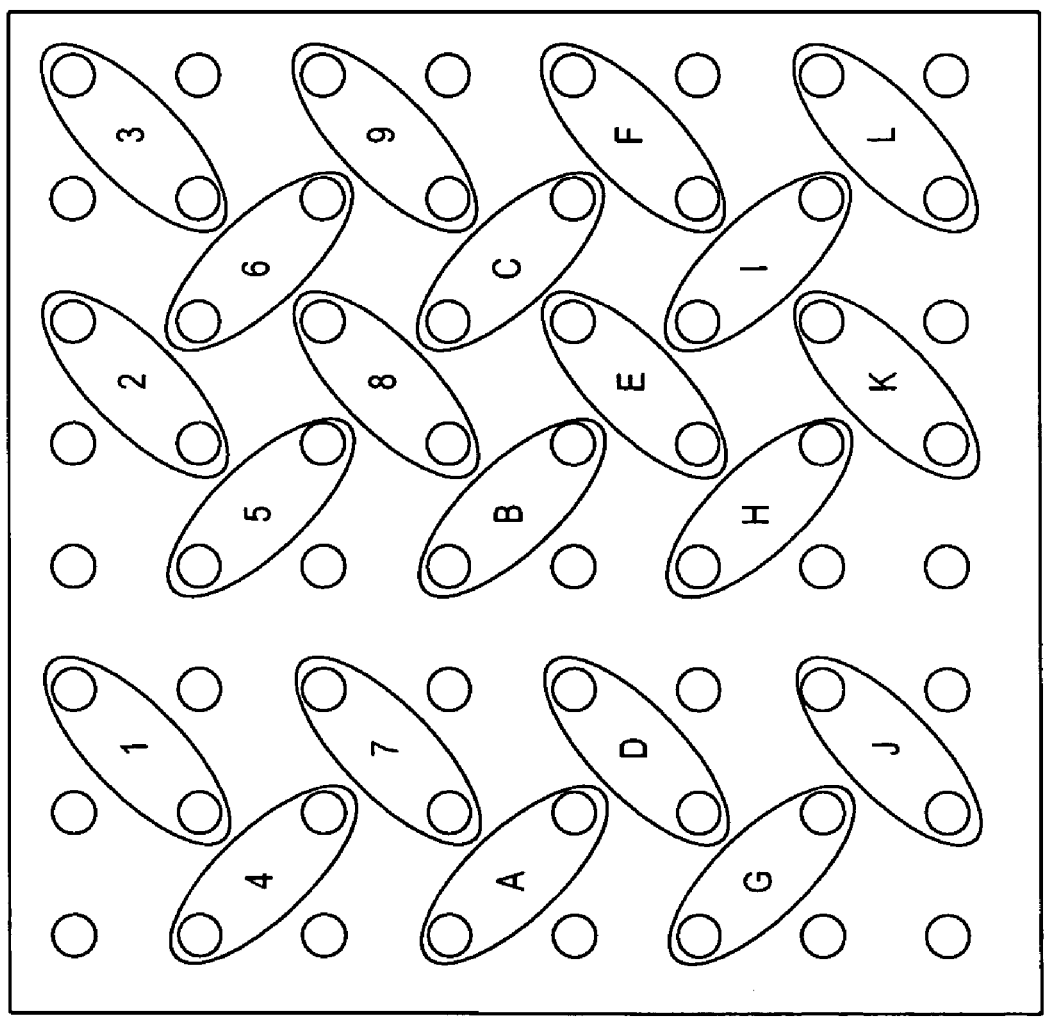
Figure 4C:
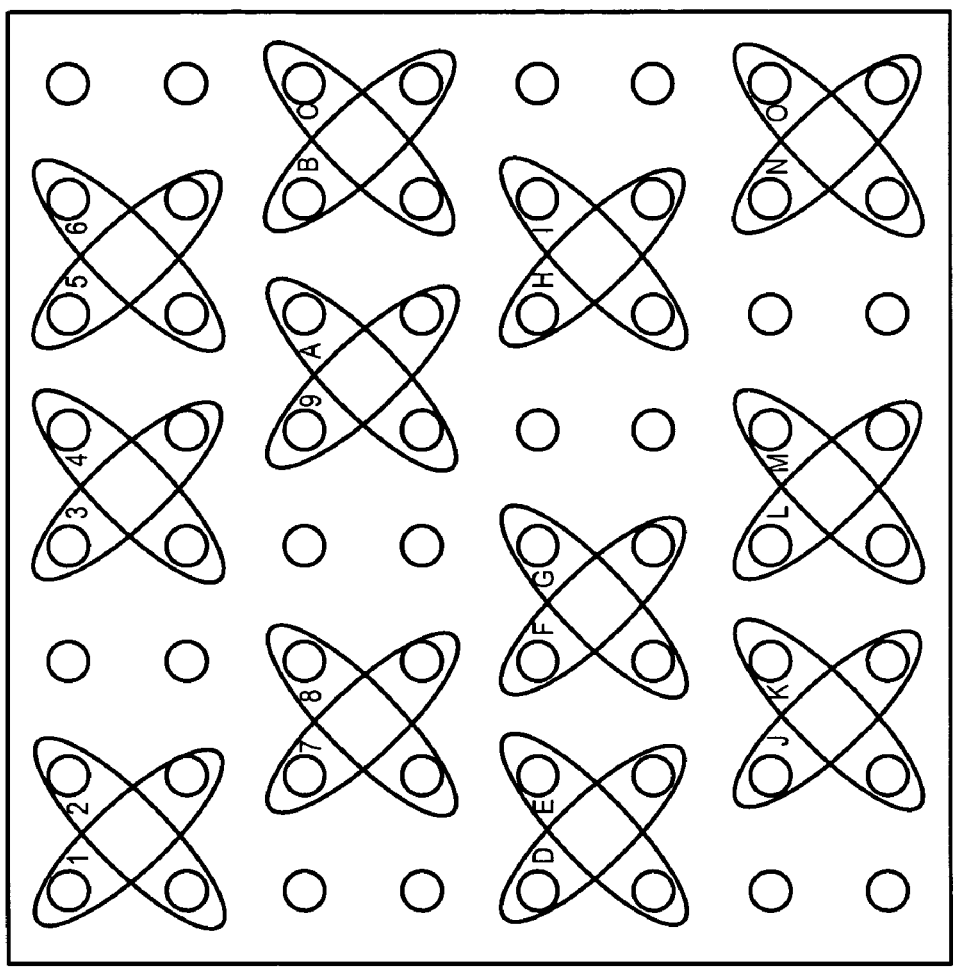

Referring to FIGS. 4A–4C, there are a plurality of pin arrangements within an 8×8 array which include one power pin for every eight differential pairs and one ground pin for every eight differential pairs. Within each 8×8 array, a differential pair is represented by a circle with a "+" sign and a circle with a "−" sign that are linked via an oval. The power pins are represented by a circle containing a "p" and the ground pins are represented by a circle containing a "g." Each differential pair is also labeled with a unique identifier.

For example, FIG. 4A shows a straight differential pair arrangement.

FIG. 4B shows a diagonal differential pair arrangement.

FIG. 4C shows a crossed differential pair arrangement.

Figure 5B:
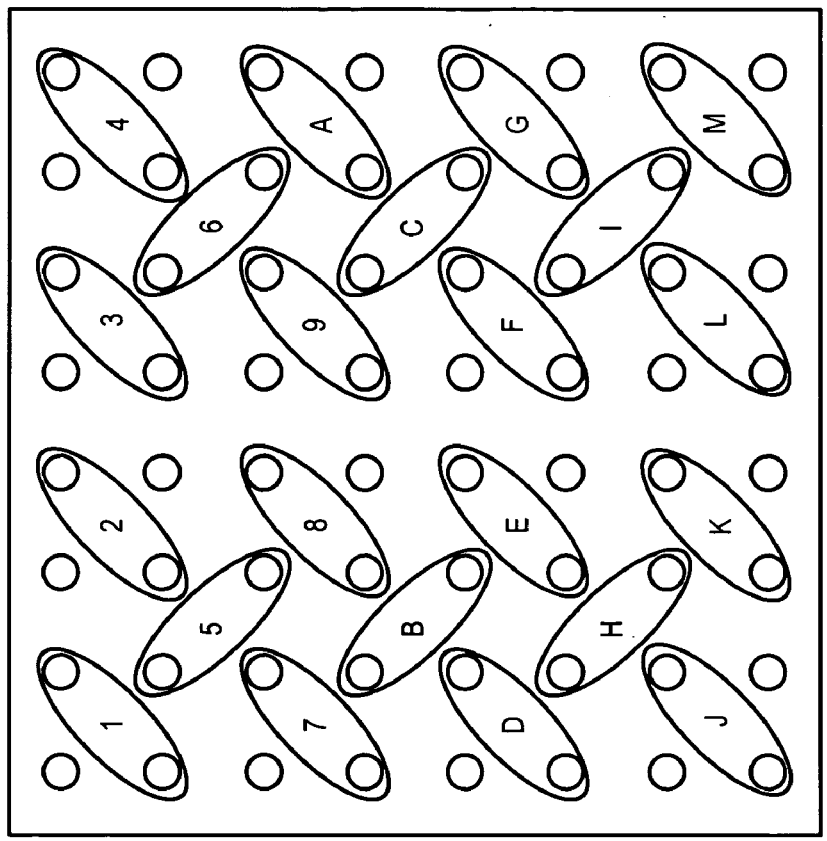
FIGS. 5A–5D, generally referred to as FIG. 5, show a plurality of examples of pin arrangements within an 8×8 array.
Figure 5A:
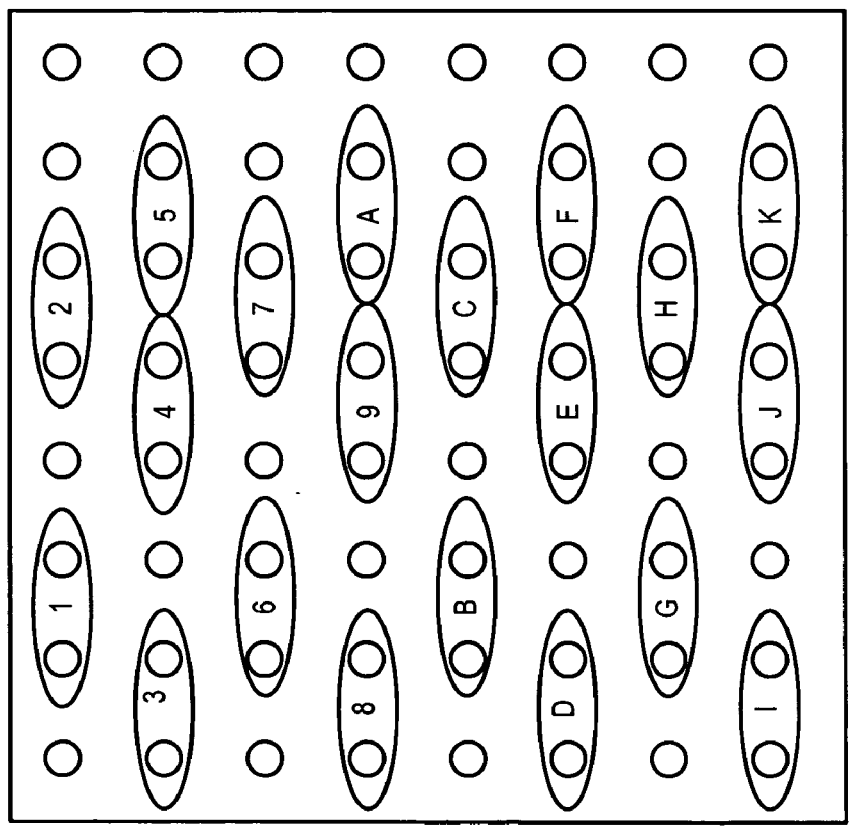
Figure 5C:
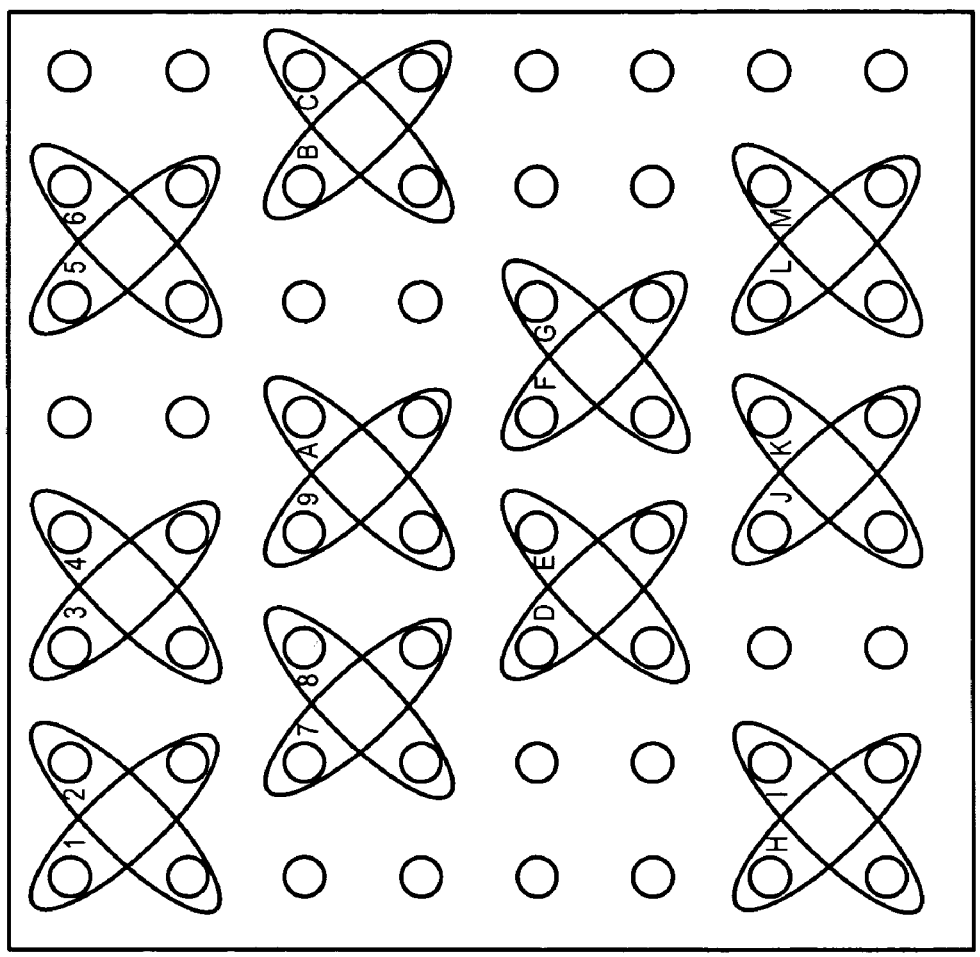

Referring to FIGS. 5A–5C, there are a plurality of pin arrangements within an 8×8 array which include one power pin for every six differential pairs and one ground pin for every six differential pairs. Within each 8×8 array, a differential pair is represented by a circle with a "+" sign and a circle with a "−" sign that are linked via an oval. The power pins are represented by a circle containing a "p" and the ground pins are represented by a circle containing a "g." Each differential pair is also labeled with a unique identifier.

For example, FIG. 5A shows a straight differential pair arrangement.

FIG. 5B shows a diagonal differential pair arrangement.

FIG. 5C shows a crossed differential pair arrangement.

Figure 5D:
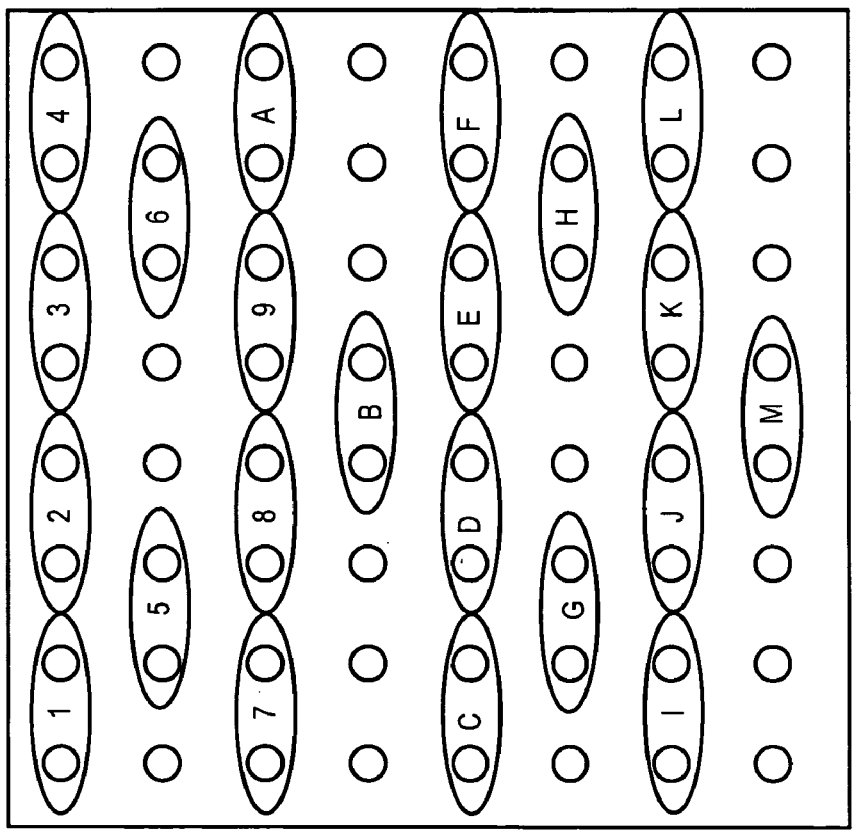

FIG. 5D shows an alternative straight differential pair arrangement.

Figure 6A:
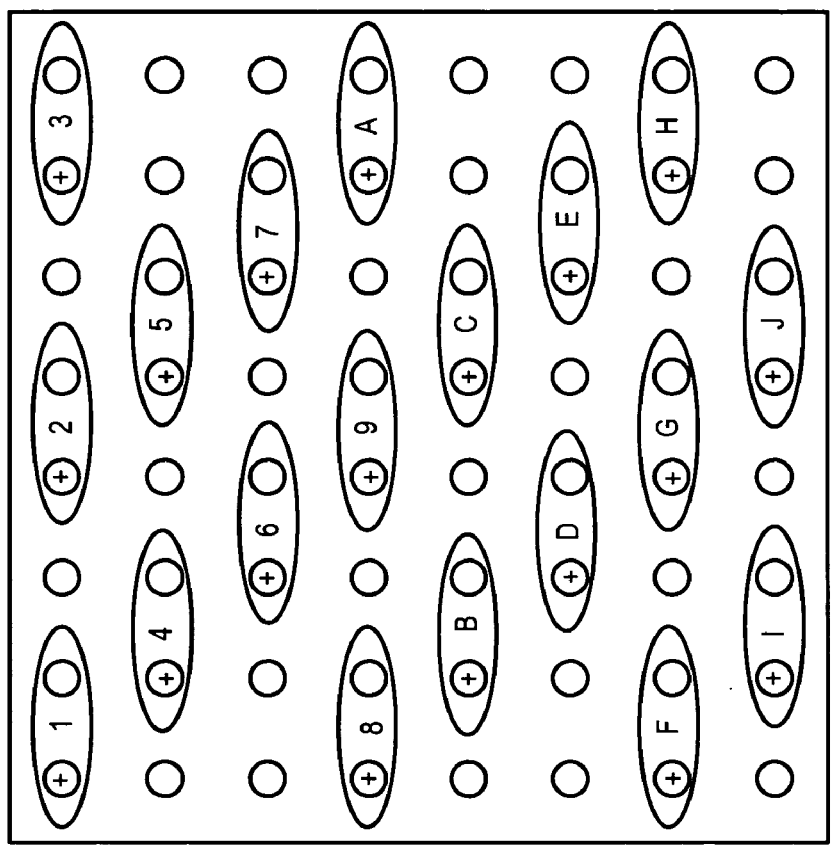
FIGS. 6A–6D, generally referred to as FIG. 6, show a plurality of examples of pin arrangements within an 8×8 array.
Figure 6B:
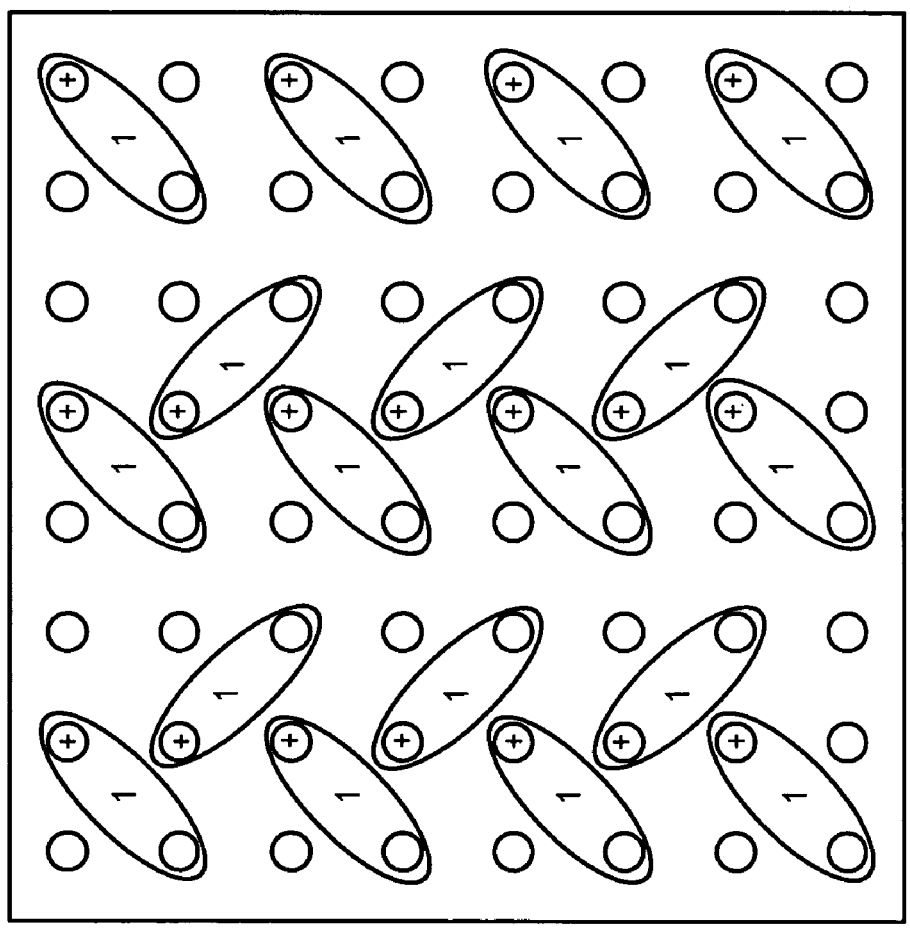
Figure 6C:
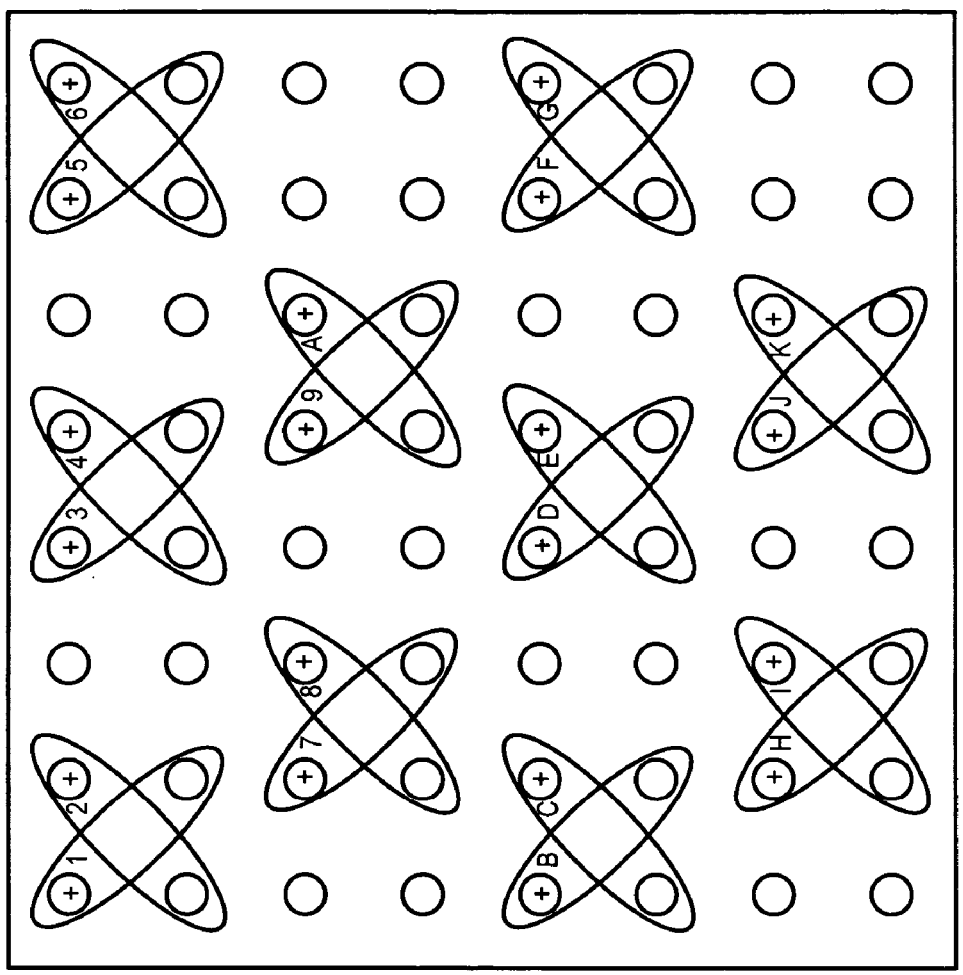

Referring to FIGS. 6A–6C, there are a plurality of pin arrangements within an 8×8 array which include one power pin for every four differential pairs and one ground pin for every four differential pairs. Within each 8×8 array, a differential pair is represented by a circle with a "+" sign and a circle with a "−" sign that are linked via an oval. The power pins are represented by a circle containing a "p" and the ground pins are represented by a circle containing a "g." Each differential pair is also labeled with a unique identifier.

For example, FIG. 6A shows a straight differential pair arrangement.

FIG. 6B shows a diagonal differential pair arrangement.

FIG. 6C shows a crossed differential pair arrangement.

Figure 6D:
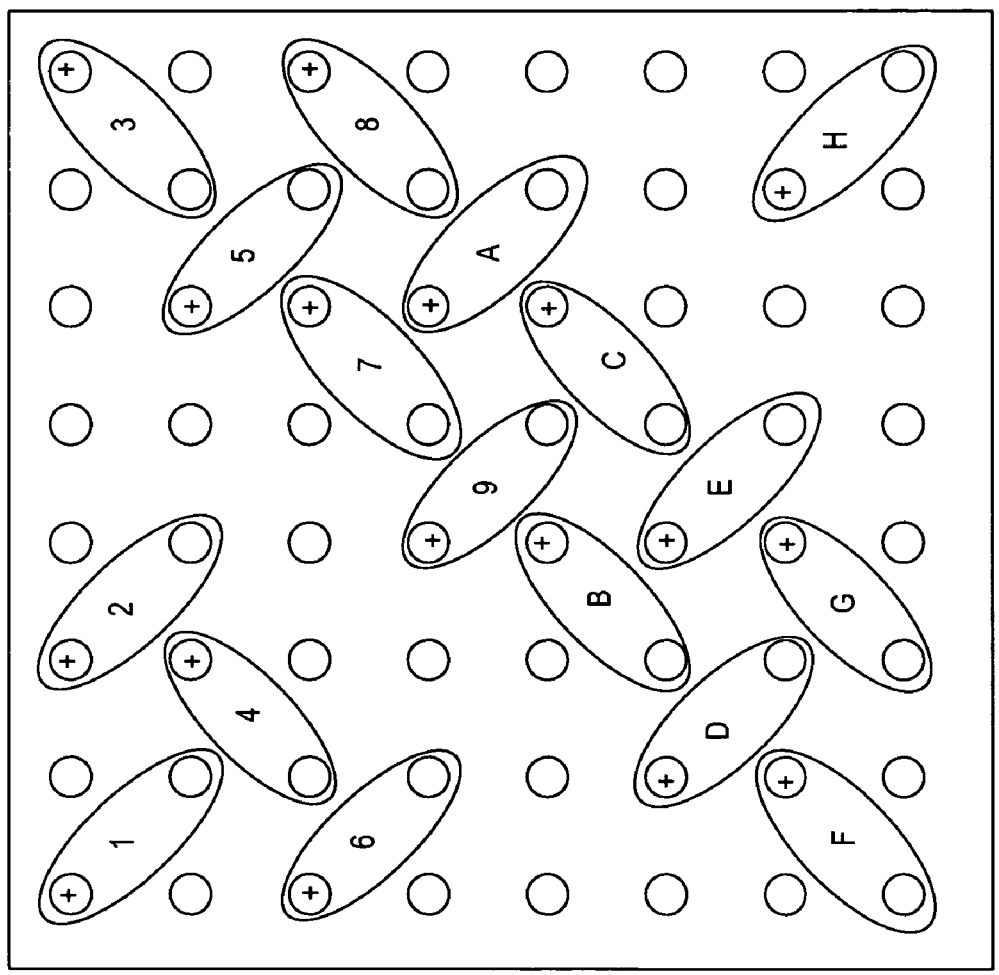

FIG. 6D shows an alternative straight differential pair arrangement.

Figure 7A:
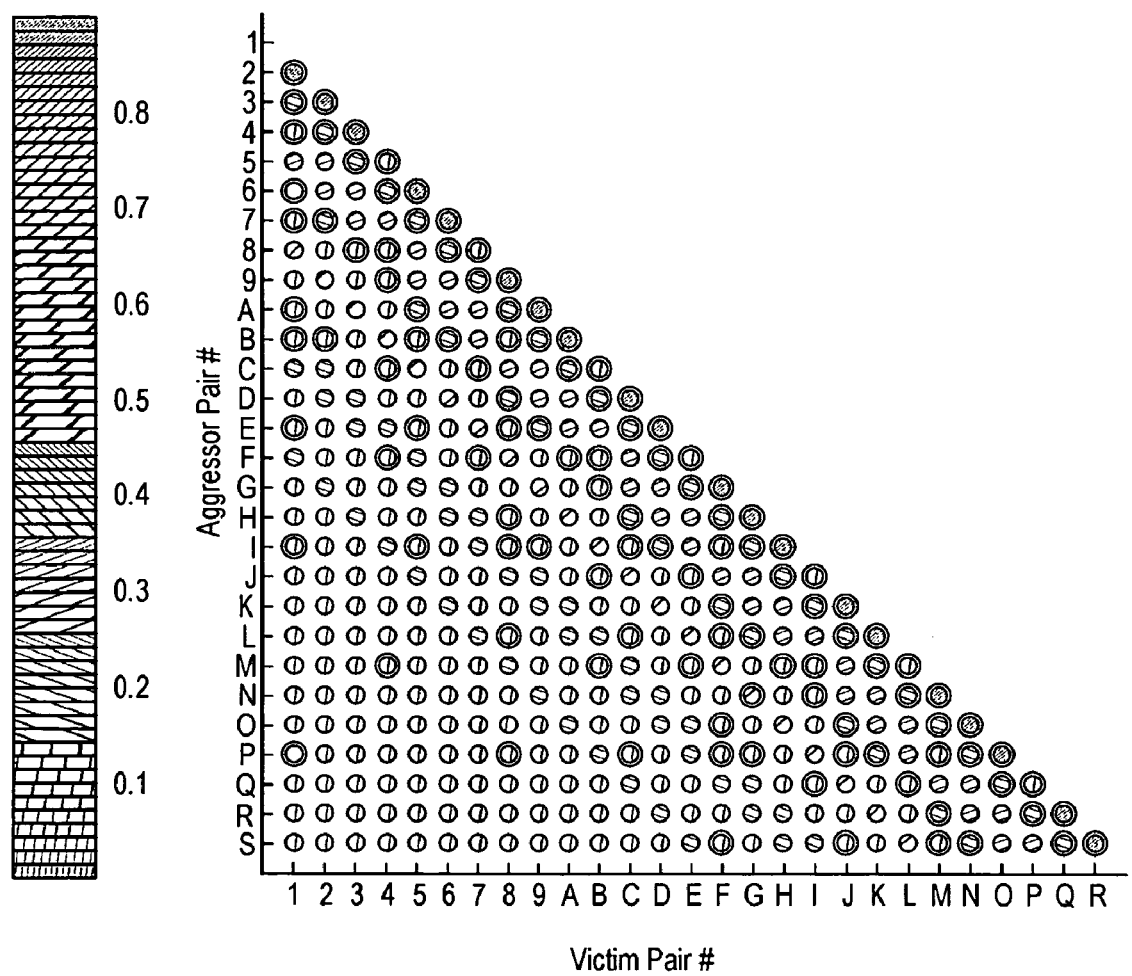
FIGS. 7A and 7B show a coupling plot and a graph of the cumulative coupling analysis for a straight maximally packed pin arrangement.
Figure 7B:
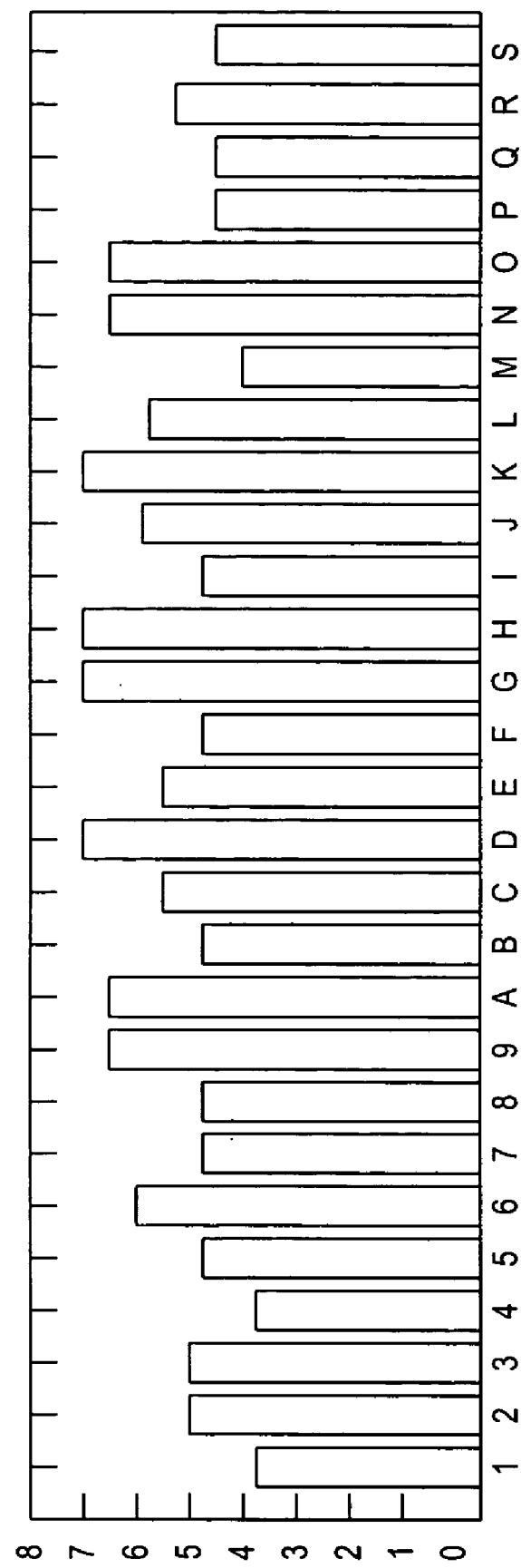

Referring to FIGS. 7A and 7B, a coupling plot and a graph of the cumulative coupling analysis for a straight maximally packed pin arrangement are shown. More specifically, as each differential pair of the pin arrangement is excited at step 222, the induced voltage at each of the other pairs is monitored at step 224. The induced voltage magnitudes are then plotted as a type of roadmap mileage plot. Rather than read through a large table of numbers, the values that are monitored are replaced by a color code as indicated by the scale along the y-axis of the coupling plot of FIG. 7A. The polarity of the induced voltage is indicated by circling negative values (i.e., uncircled symbols indicate a positive coupled voltage). For the coupling plot shown in FIG. 7A, the plot indicates that the strongest coupling occurs between adjacent neighbors, such as for example, between loop 1 and loop 2 and between loop G and loop H.

Figure 8:
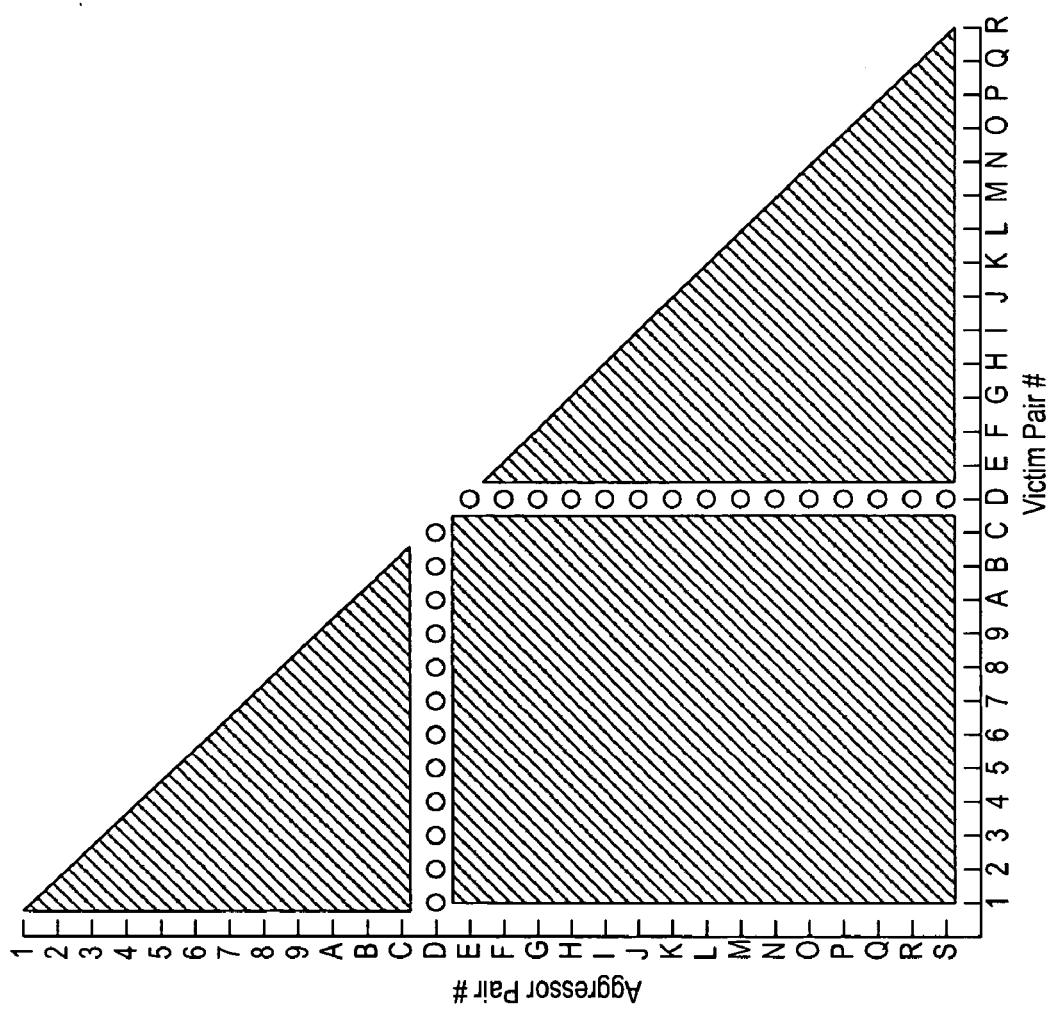
FIG. 8 shows an example of the consideration of coupled noise due to each aggressor for a particular victim.

Referring to FIG. 8, an example of the consideration of coupled noise due to each aggressor for a particular victim is shown. More specifically, the system considers the coupled noise due to each aggressor acting on a particular victim. For example, FIG. 8 shows the coupled noise acting on loop D. Loop D is a good example because of its location close to the center of the array. Accordingly, the couple noise of loop D exhibits minimal edge effects.

Figure 9:
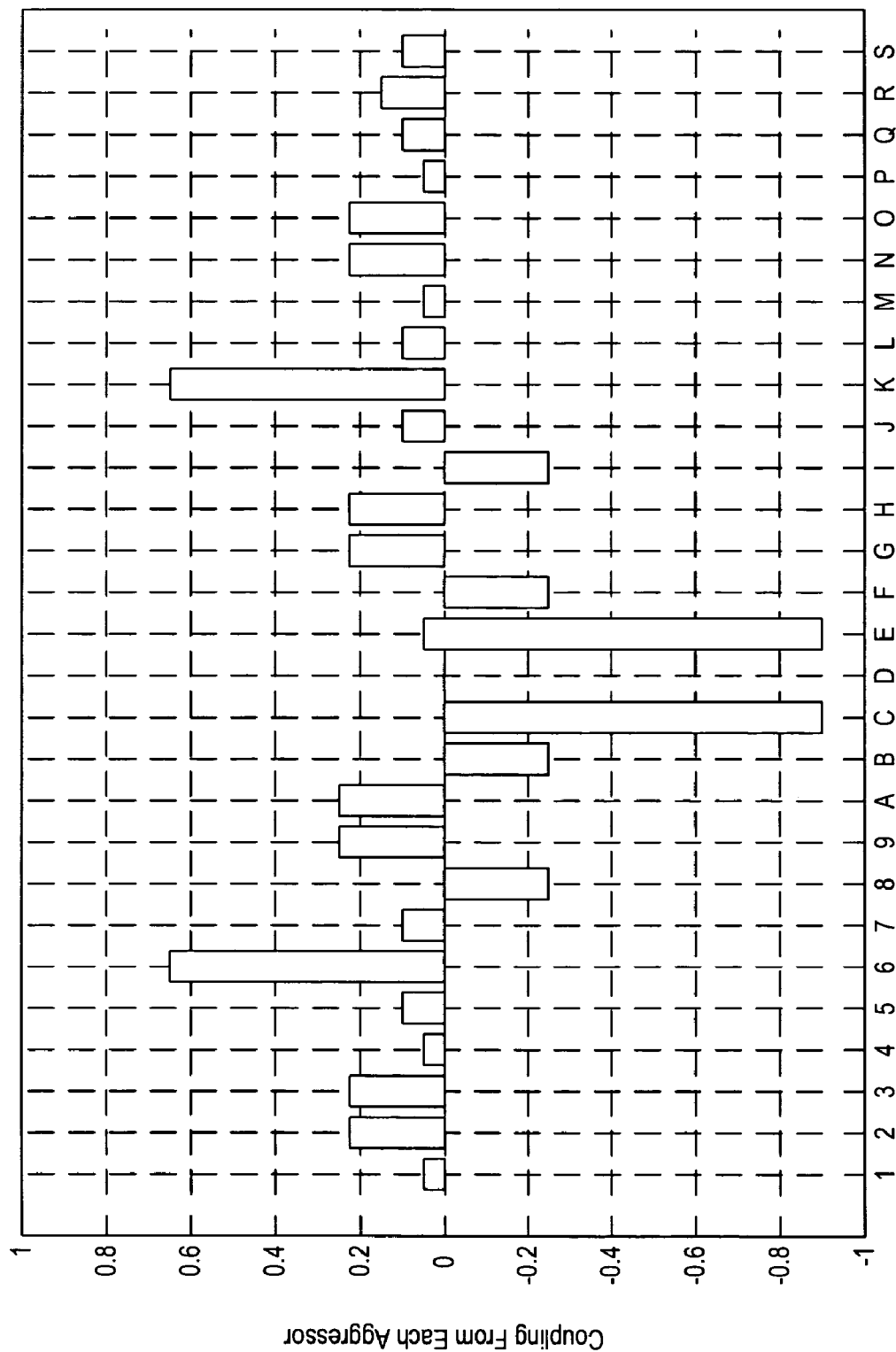
FIG. 9 shows a graph of the analysis of the coupling onto the particular victim.

Referring to FIG. 9, a graph of the analysis of the coupling onto the particular victim is shown. More specifically, FIG. 9 shows the analysis of the coupled noise due to each aggressor acting on Loop D of the plot of FIG. 7.

The study of the individual victim aggressor behavior aids in the understanding of which pin arrangements are likely to produce less noise coupling. However, a simple figure of merit is desirable to compare various pin arrangements. Accordingly, it is desirable to look at all the noise coupled onto a victim due to all aggressors switching. The noise induced on a victim due to all aggressors switching depends on the polarity of each component. For example, the noise due to two aggressors might cancel out if the two aggressors are oriented and excited appropriately. However, a worst case can be determined where all excitations cause victim noise of the same phase so that no cancellation occurs. Thus, the sum of the magnitude of the voltage response due to each aggressor is used, rather than vectorially summing voltages.

For the case of loop D in the maximally paced straight configuration, summing vectorially generates a 0.03 mV result and summing magnitudes generates a 3.6 mV result.

Figure 10:
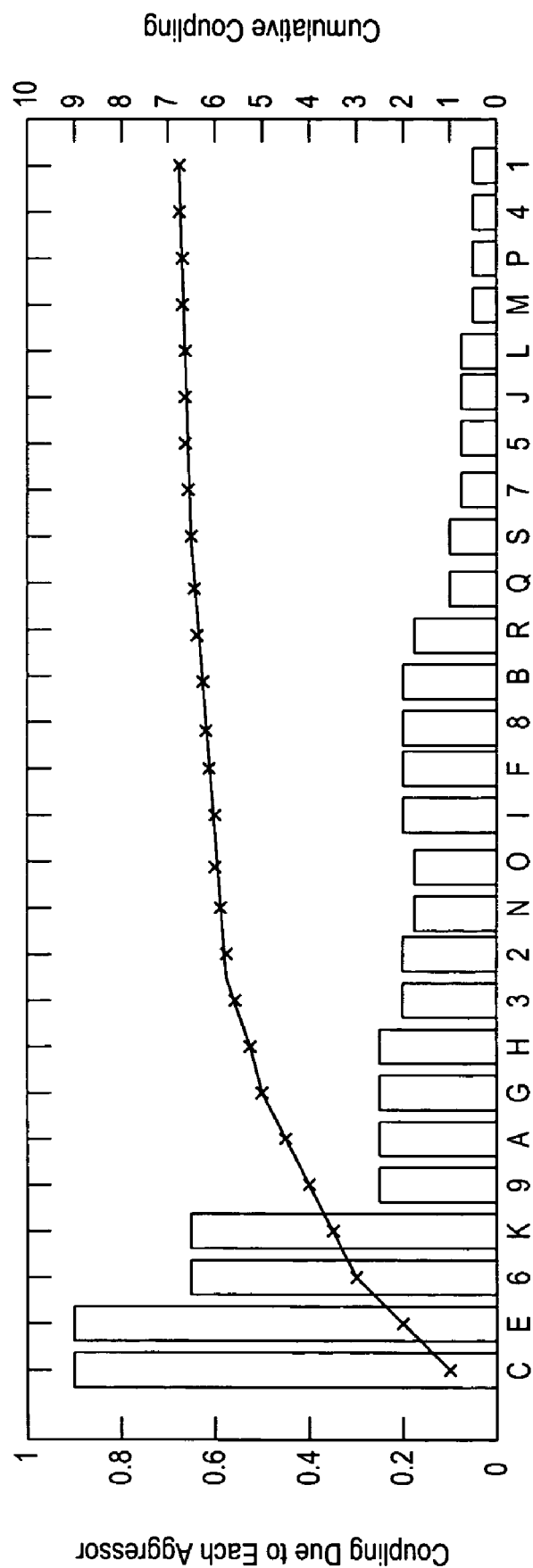
FIG. 10 shows a graph of the coupling onto a particular victim ordered by magnitude.

More specifically, referring to FIG. 10, a graph of the coupling onto the loop D victim ordered by magnitude is shown. Thus it is possible to determine which loops contributed the most to coupled noise and also beyond which aggressors the coupled noise becomes negligible. For example, for this arrangement, the four strongest aggressors coupled just under half of the total noise. There are an additional approximately fourteen aggressors that each contribute a moderate amount of noise. While the aggressor excitations are arranged (in terms of polarity) to give maximum coupled noise, each aggressor differential pair is assumed to be perfectly balanced. If any pair is unbalanced (e.g., the + signal is skewed with respect to the − signal, a pair might contribute additional noise. It is possible that the additional noise may dominate the perfectly balanced noise.

Figure 11:
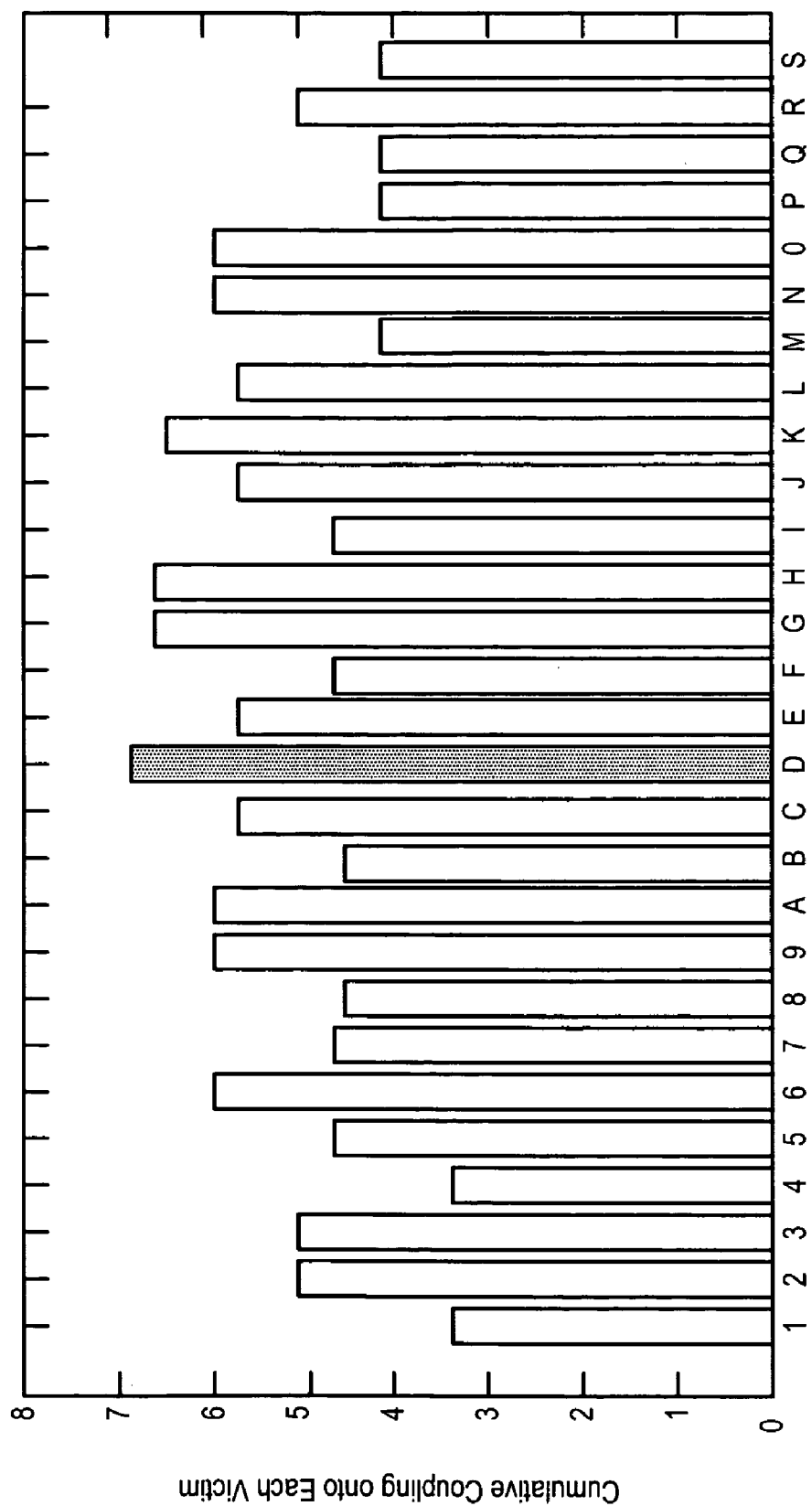
FIG. 11 shows a graph of the cumulative coupling analysis with a particular victim identified.

Referring to FIG. 11, a graph of the cumulative coupling analysis with a particular victim identified is shown. More specifically, victim loop D has cumulative coupling of approximately 68, which corresponds to the maximum of the cumulative coupling curves of FIG. 11. The cumulative coupling on loops at the corners of the 8×8 array (e.g., loops 1, 4, M, P, Q and S) is the lowest, as these loops have the fewest near neighbors. Loops at the middle of the array (e.g., loops 9, A, D, G, H and K) show the most coupling. There do not appear to be any quiet loops or noisy loops; all loops see about the same amount of noise (other than effects due to truncation of simulation space as mentioned above).

Figure 12A:
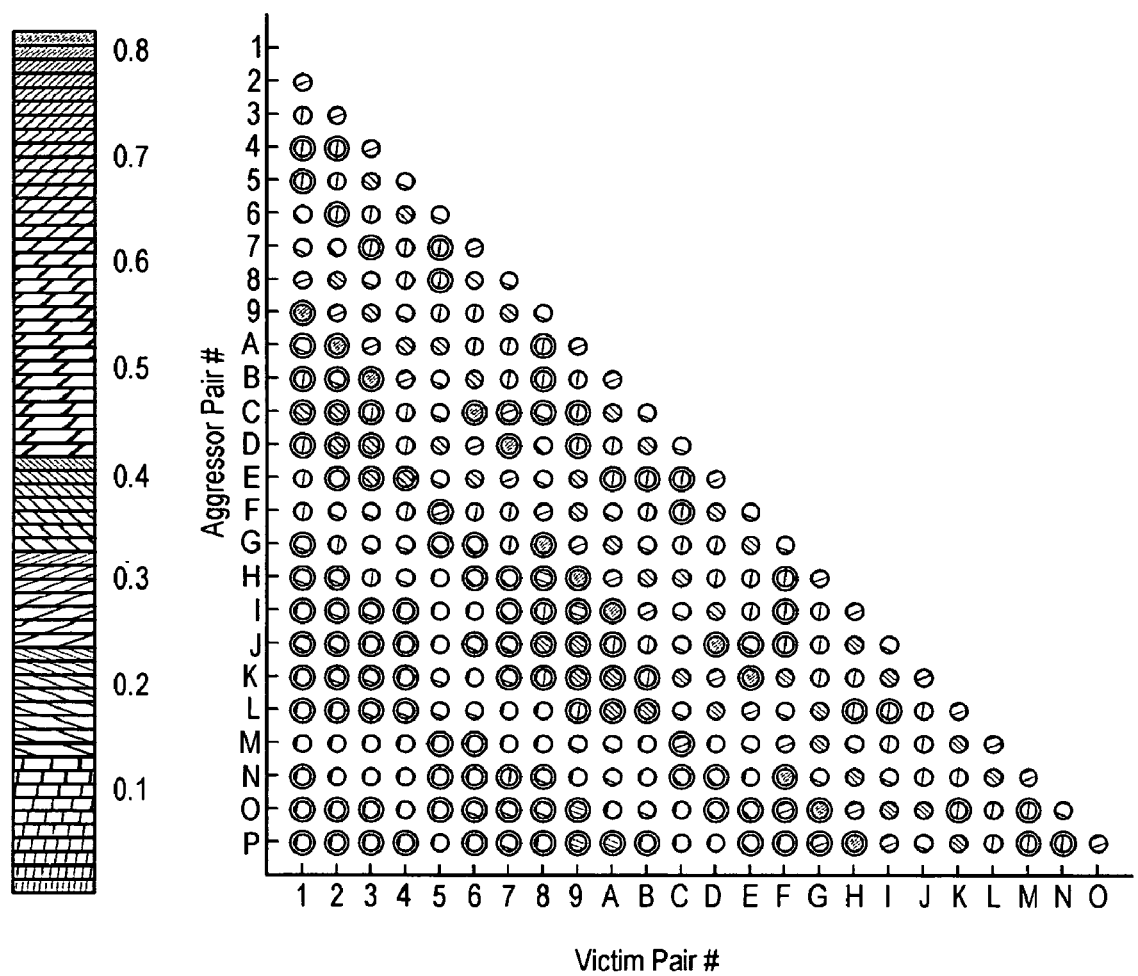
FIGS. 12A and 12B show a coupling plot and a graph of the cumulative coupling analysis for a diagonal maximally packed pin arrangement.
Figure 12B:
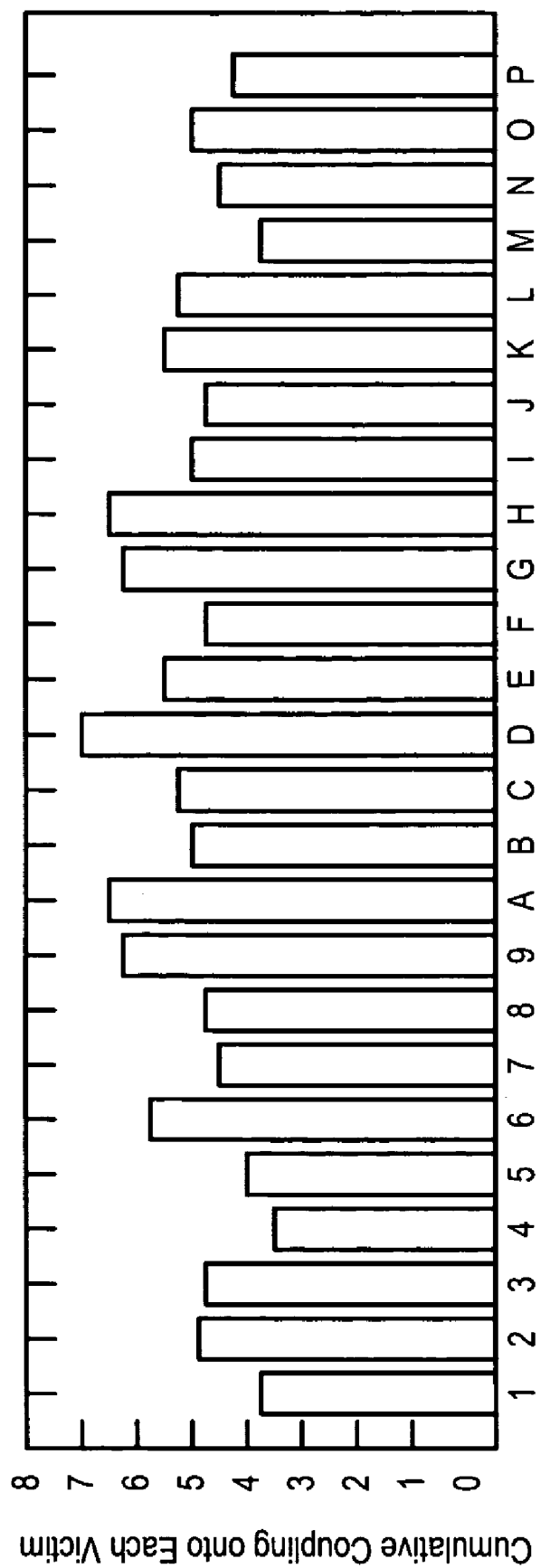
Figure 13A:
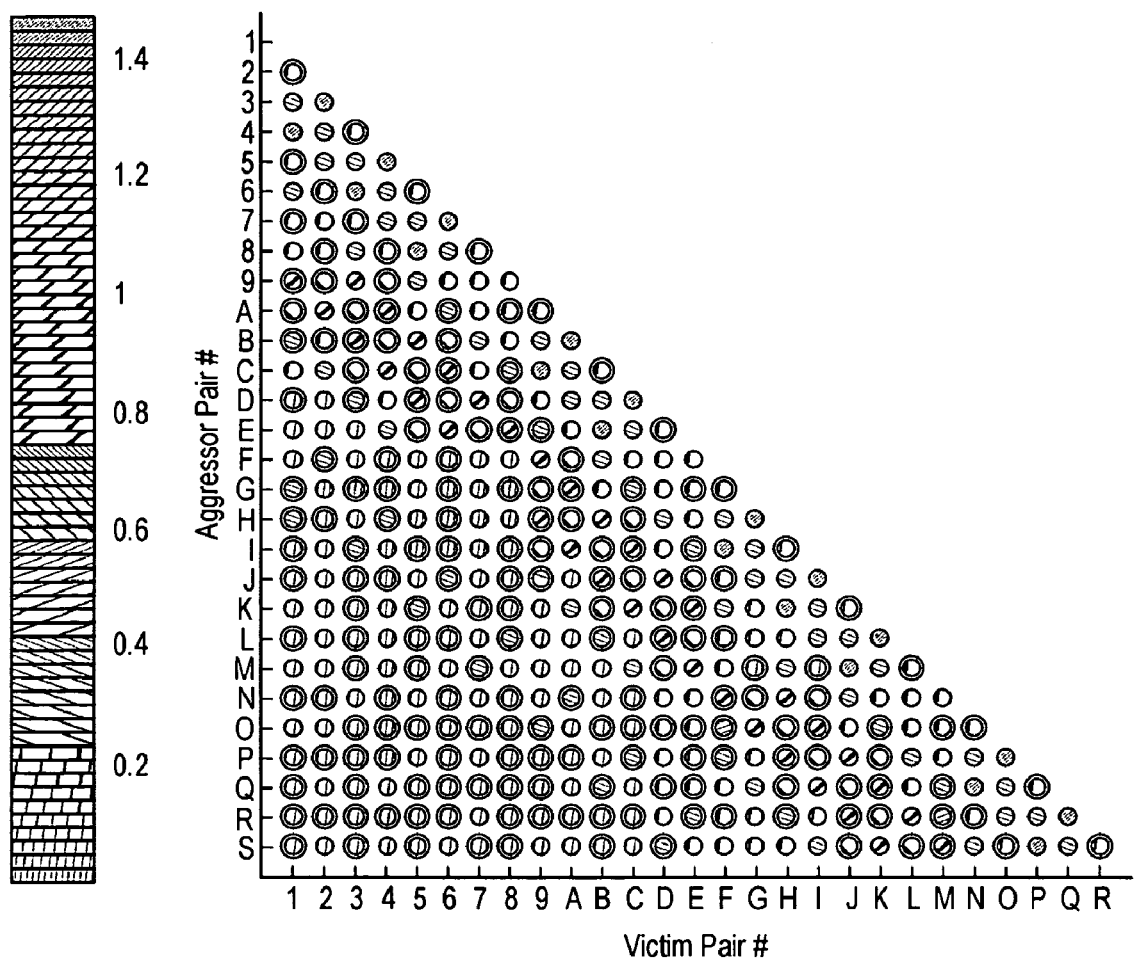
FIGS. 13A and 13B show a coupling plot and a graph of the cumulative coupling analysis for a crossed maximally packed pin arrangement.
Figure 13B:
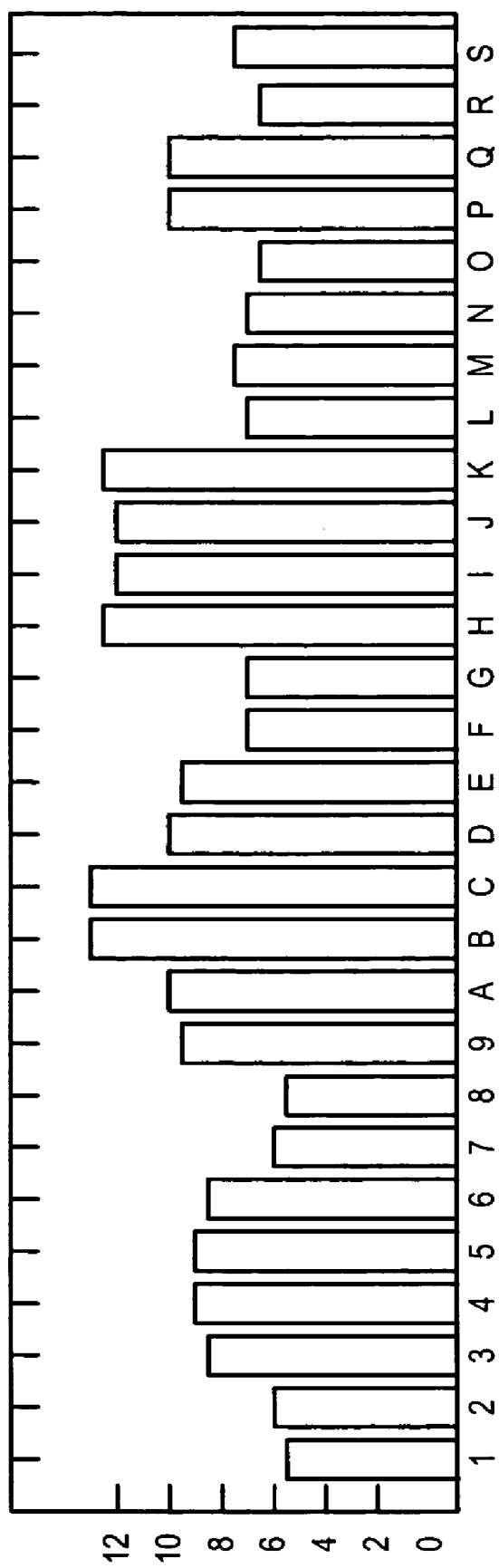
Figure 14A:
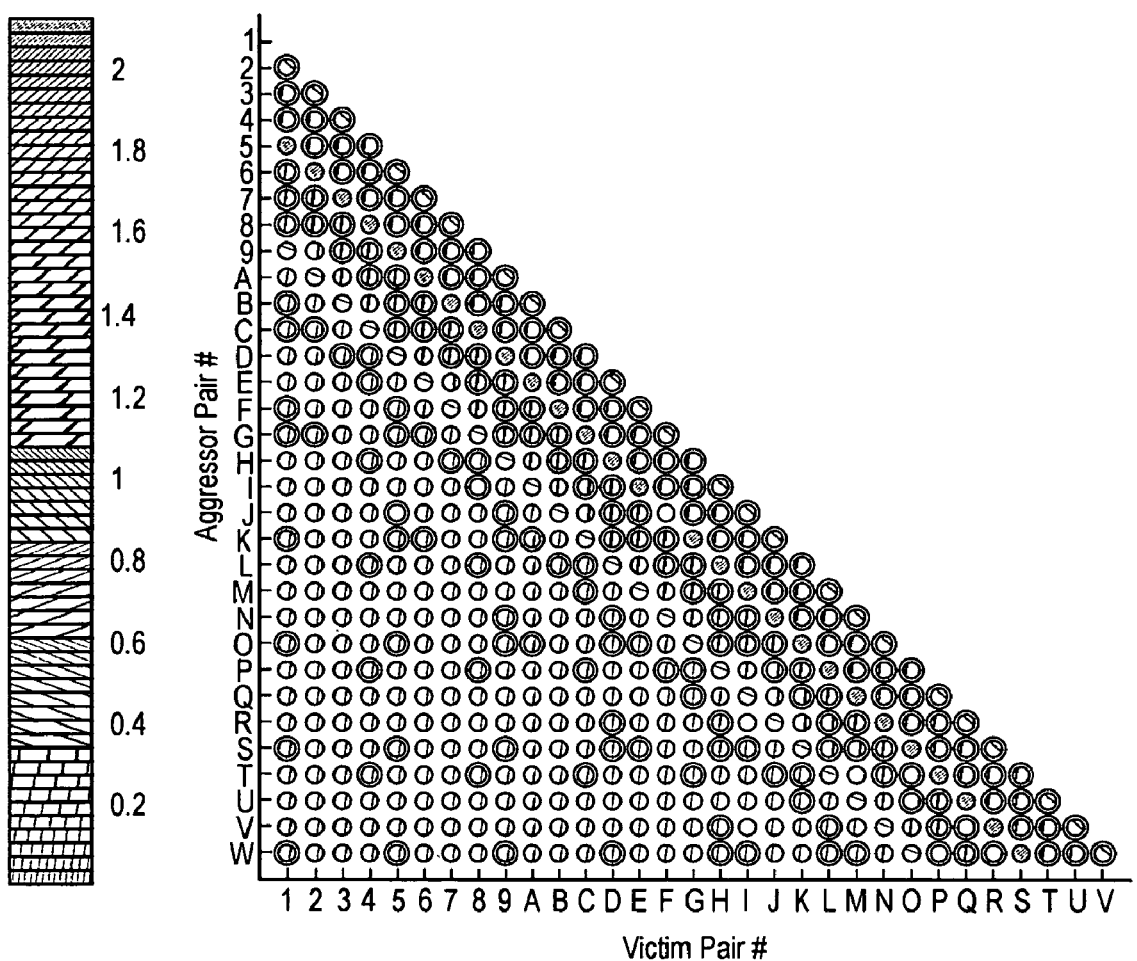
FIGS. 14A and 14B show a coupling plot and a graph of the cumulative coupling analysis for an aligned maximally packed pin arrangement.
Figure 14B:
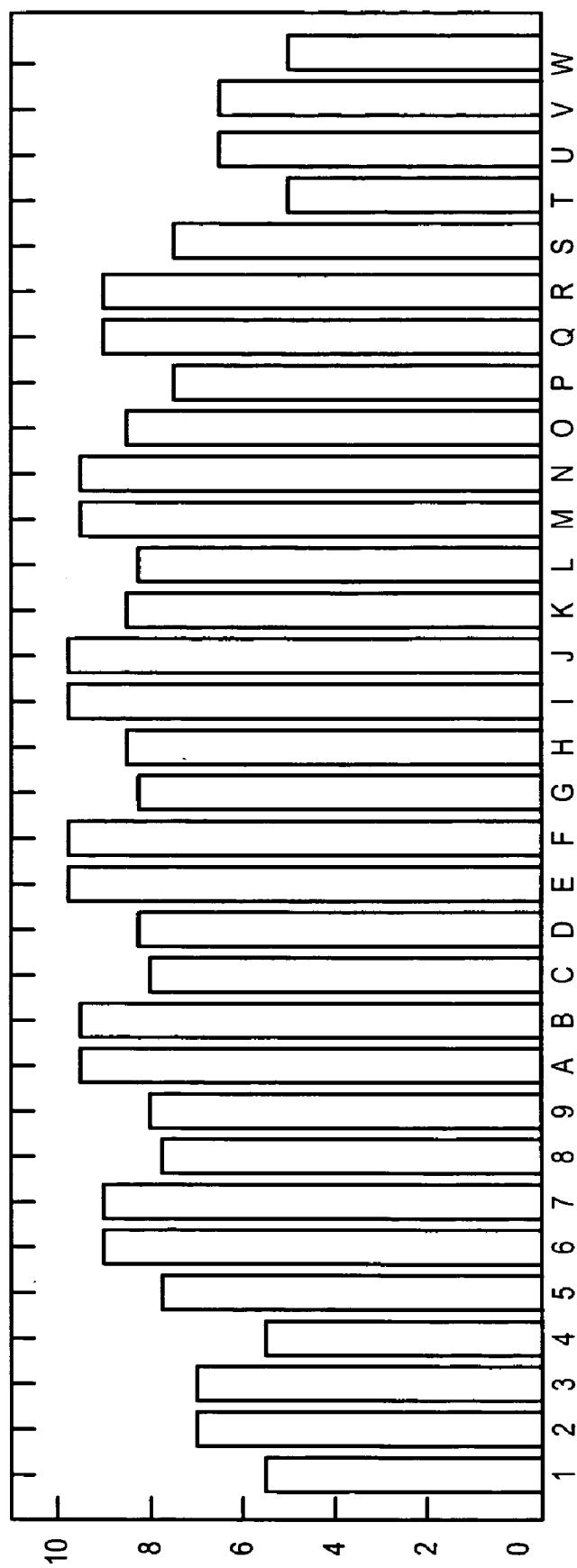

FIGS. 12, 13 and 14 show the coupling plot and graph of cumulative coupling analysis for the pin arrangements set forth in FIGS. 3B, 3C and 3D, respectively. More specifically, referring to FIGS. 12A and 12B, a coupling plot and a graph of the cumulative coupling analysis for a diagonal maximally packed pin arrangement are shown. Referring to FIGS. 13A and 13B, a coupling plot and a graph of the cumulative coupling analysis for a crossed maximally packed pin arrangement are shown. Referring to FIGS. 14A and 14B, a coupling plot and a graph of the cumulative coupling analysis for an aligned maximally packed pin arrangement are shown.

Figure 15:
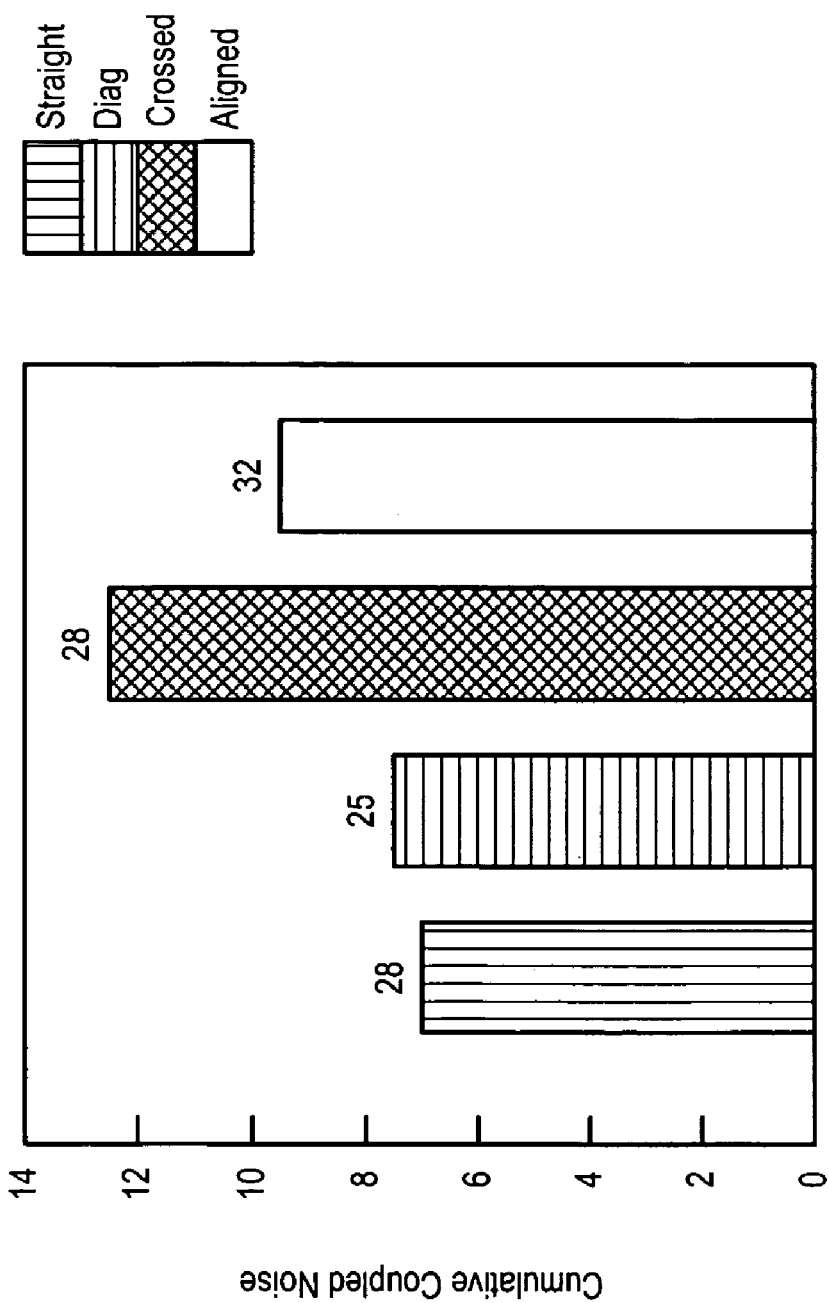
FIG. 15 shows a graph of the cumulative coupling for each maximally packed arrangement.

Referring to FIG. 15, a graph of the cumulative coupling for each maximally packed arrangement is shown. In the graph, the bar represents a maximum cumulative coupling observed within each of the arrangements. The number above the bar represents the number of loops within each respective pin arrangement. With the maximally packed pin arrangements, the crossed and aligned pin arrangements show significantly higher coupling than the straight or diagonal pin arrangements.

Figure 16A:
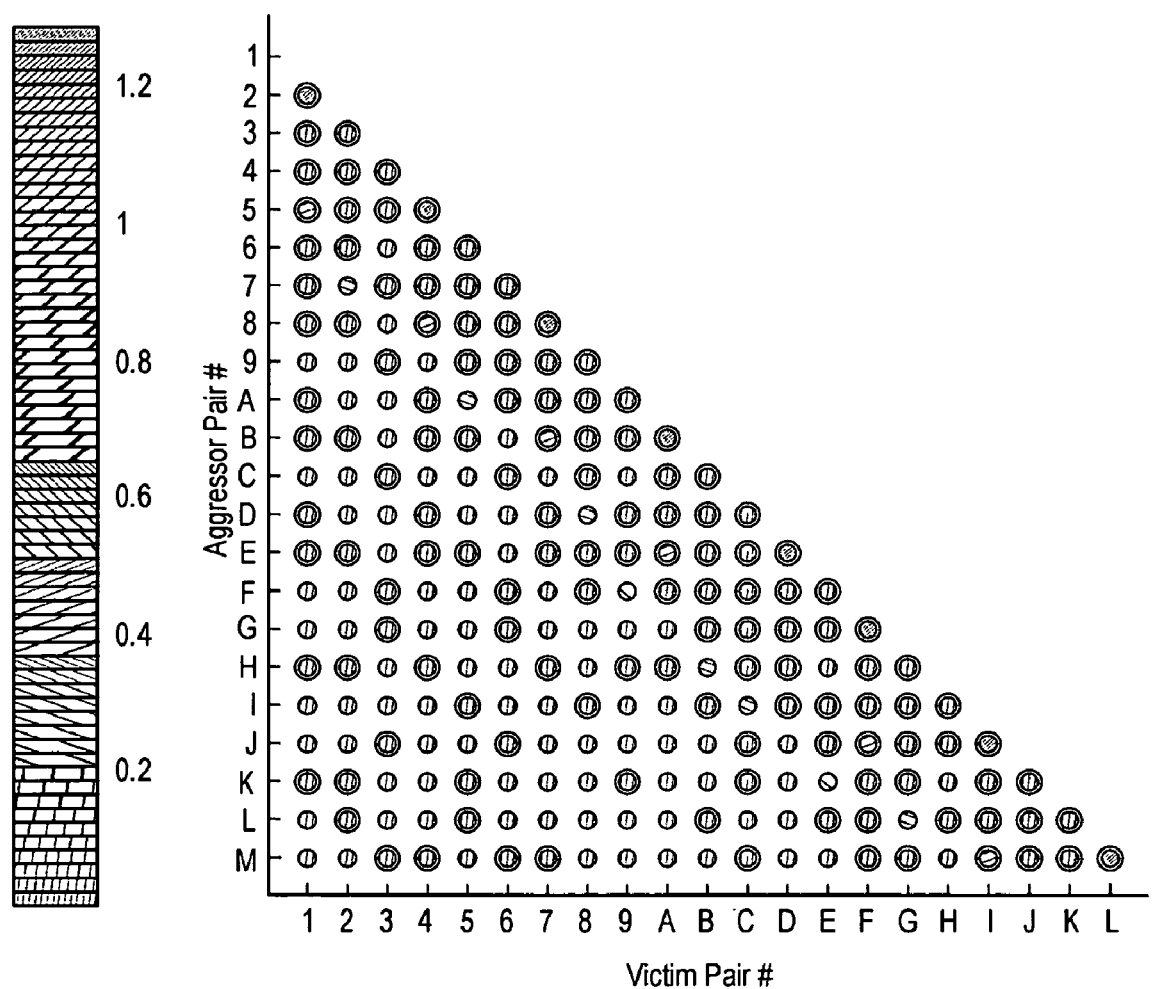
FIGS. 16A and 16B show a coupling plot and a graph of the cumulative coupling analysis for a straight 8:1:1 pin arrangement.
Figure 16B:
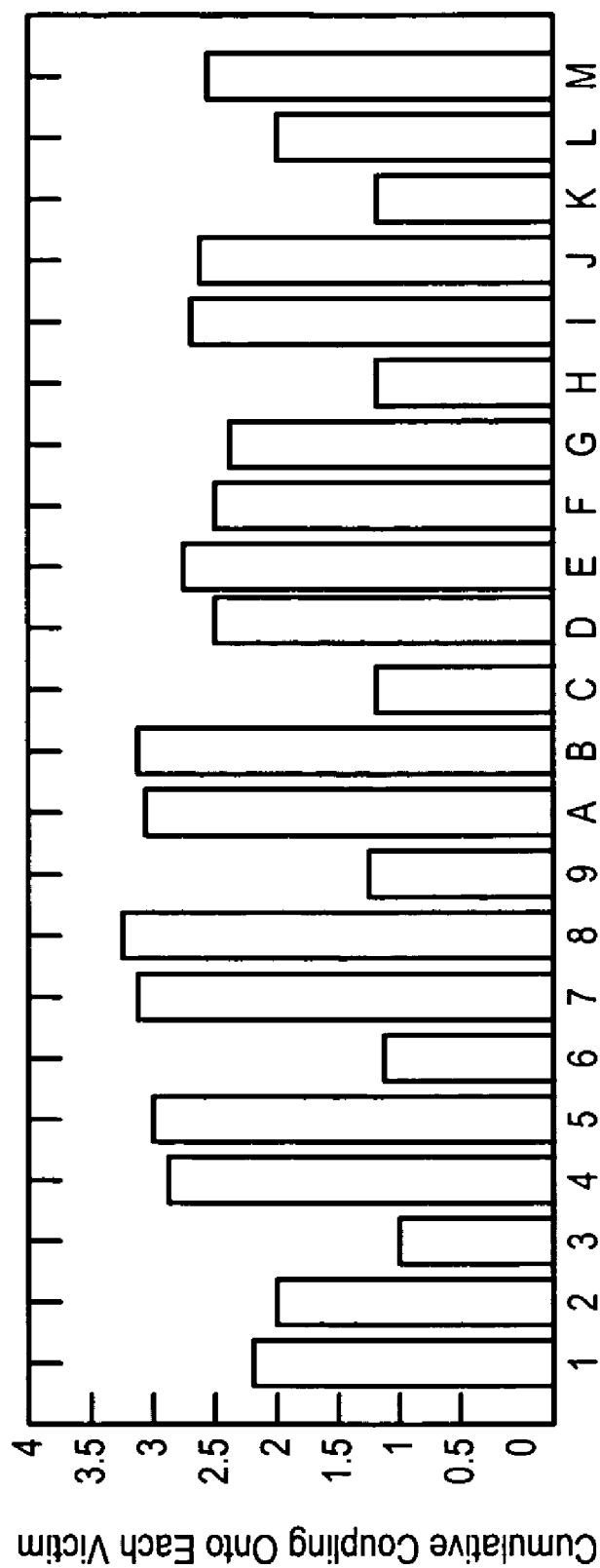
Figure 17A:
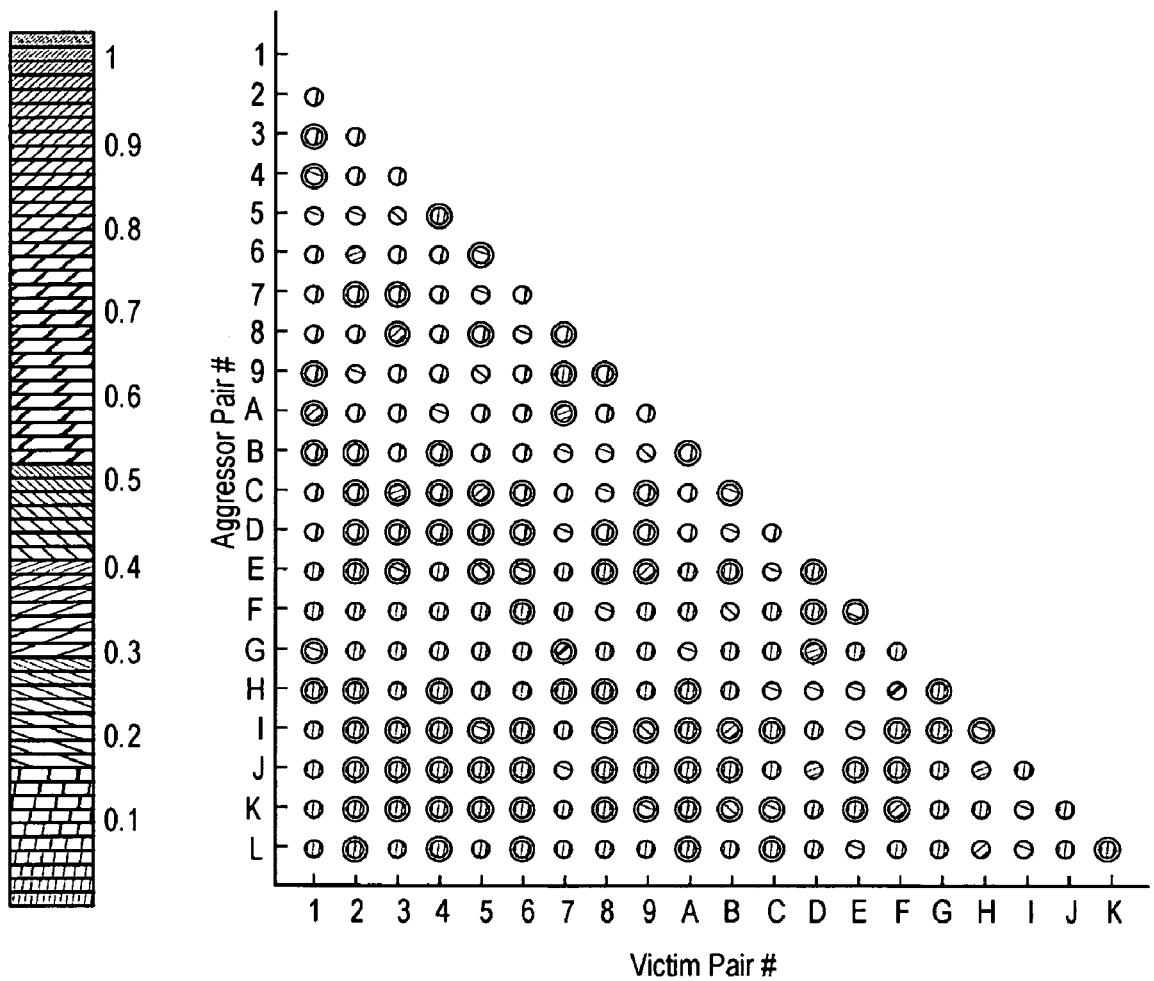
FIGS. 17A and 17B show a coupling plot and a graph of the cumulative coupling analysis for a diagonal 8:1:1 pin arrangement.
Figure 17B:
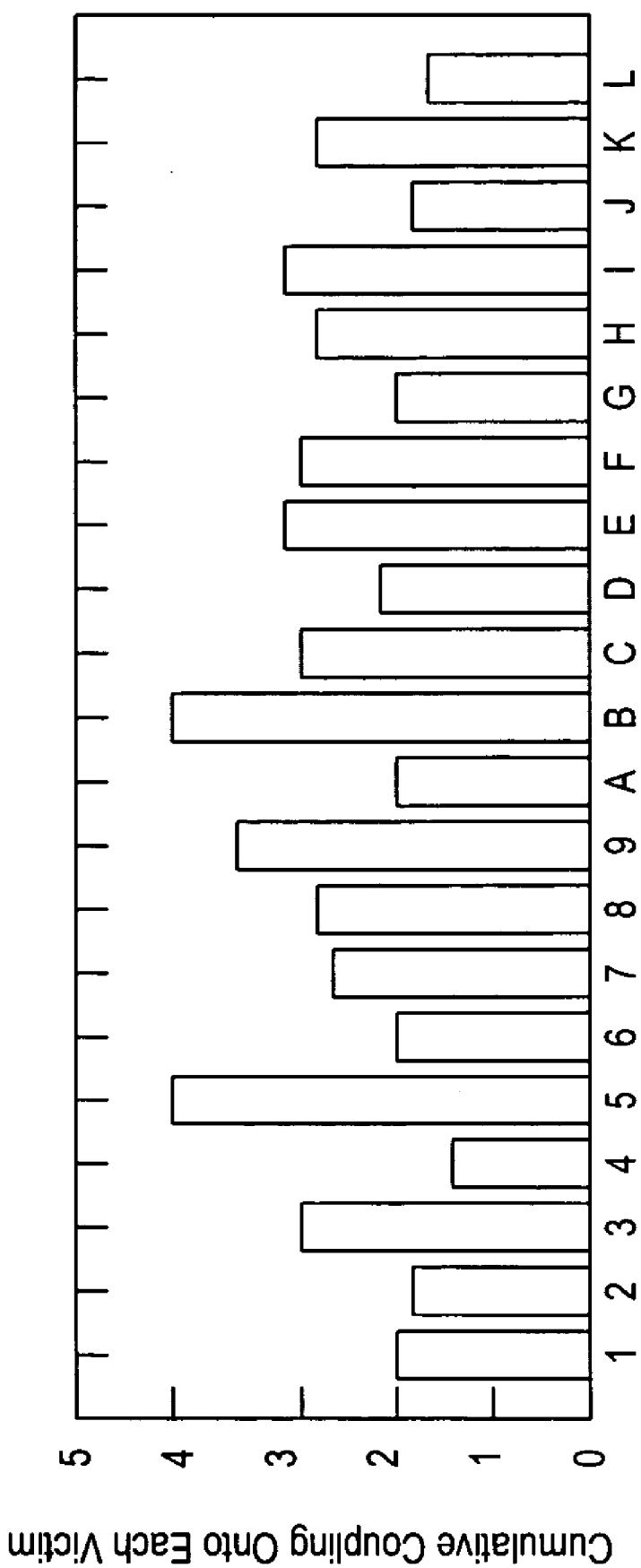
Figure 18A:
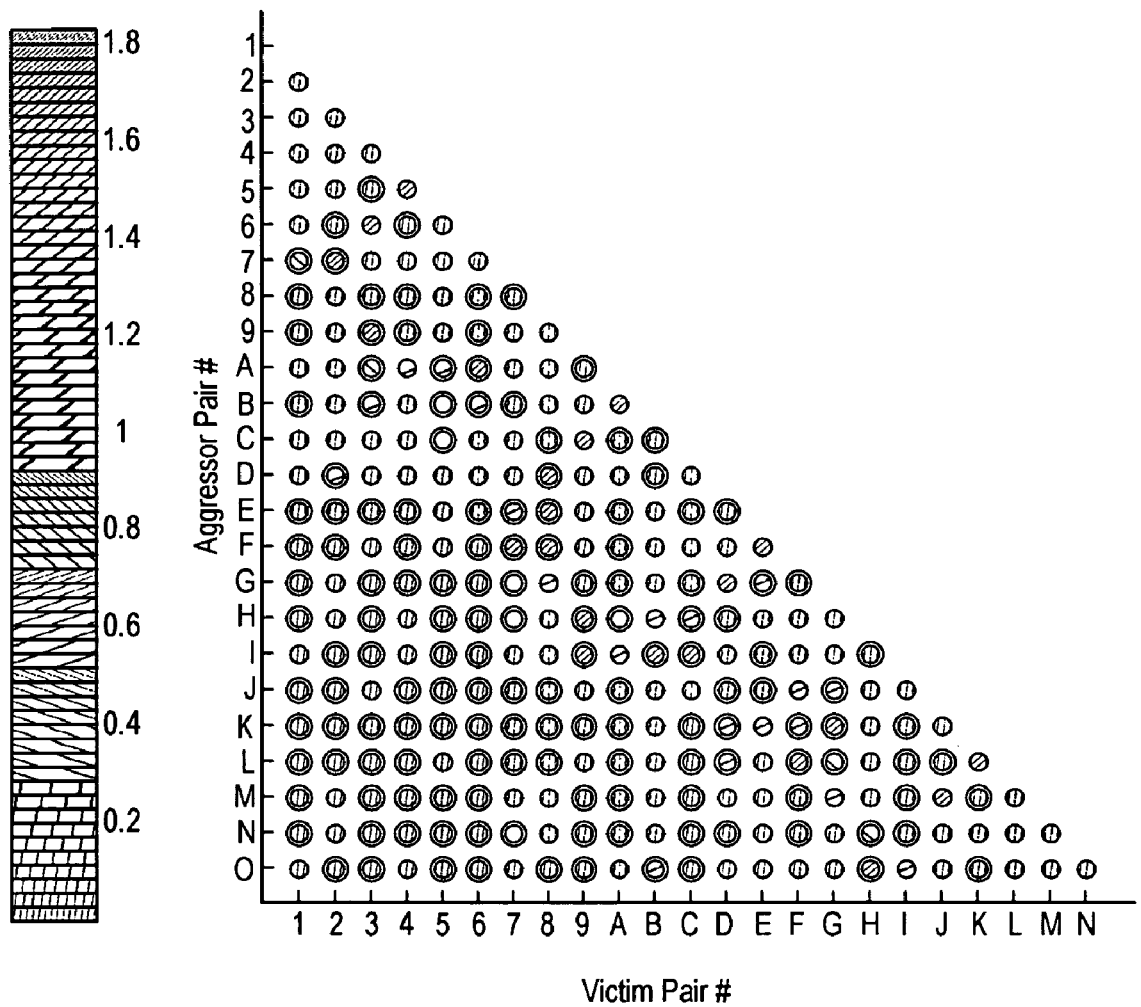
FIGS. 18A and 18B show a coupling plot and a graph of the cumulative coupling analysis for a crossed 8:1:1 pin arrangement.
Figure 18B:
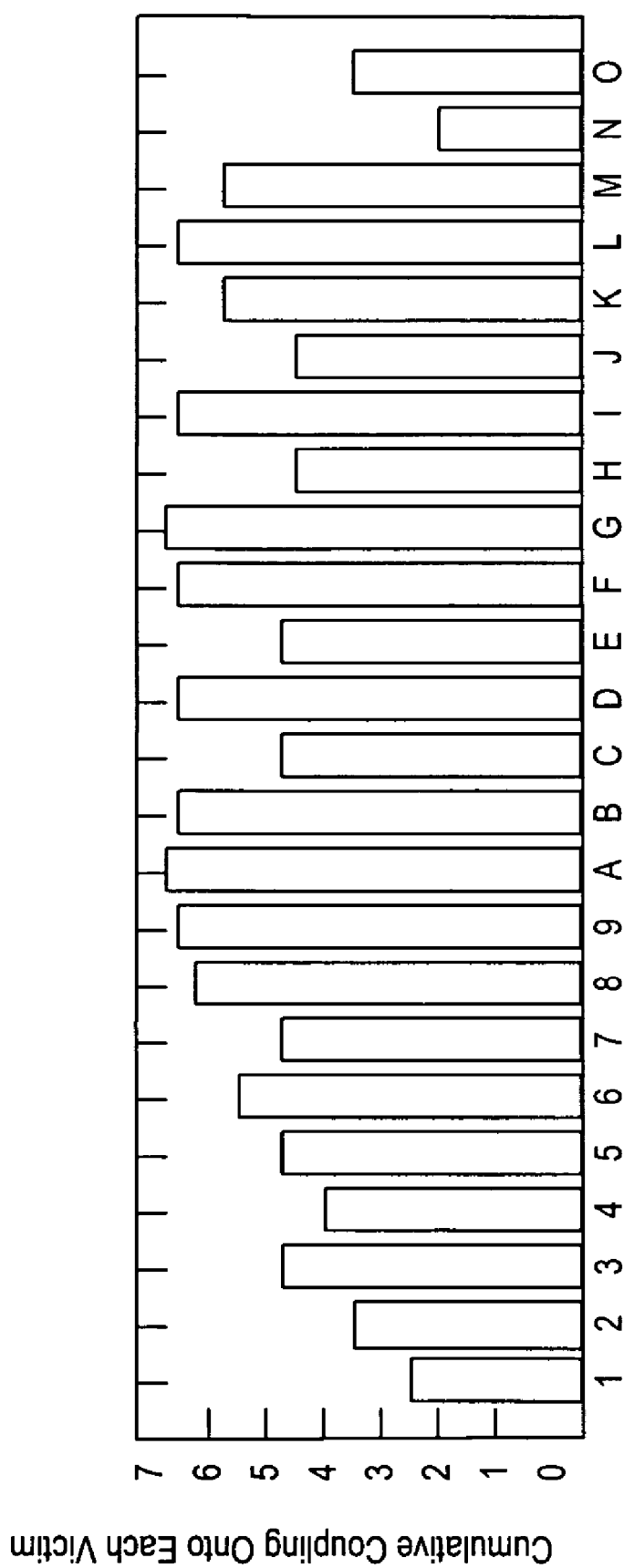

FIGS. 16, 17 and 18 show the coupling plot and graph of cumulative coupling analysis for the 8:1:1 pin arrangements set forth in FIGS. 4A, 4B and 4C, respectively. More specifically, referring to FIGS. 16A and 16B, a coupling plot and a graph of the cumulative coupling analysis for a straight 8:1:1 pin arrangement are shown. Referring to FIGS. 17A and 17B, a coupling plot and a graph of the cumulative coupling analysis for a diagonal 8:1:1 pin arrangement are shown. Referring to FIGS. 18A and 18B, a coupling plot and a graph of the cumulative coupling analysis for a crossed 8:1:1 pin arrangement are shown.

Figure 19:
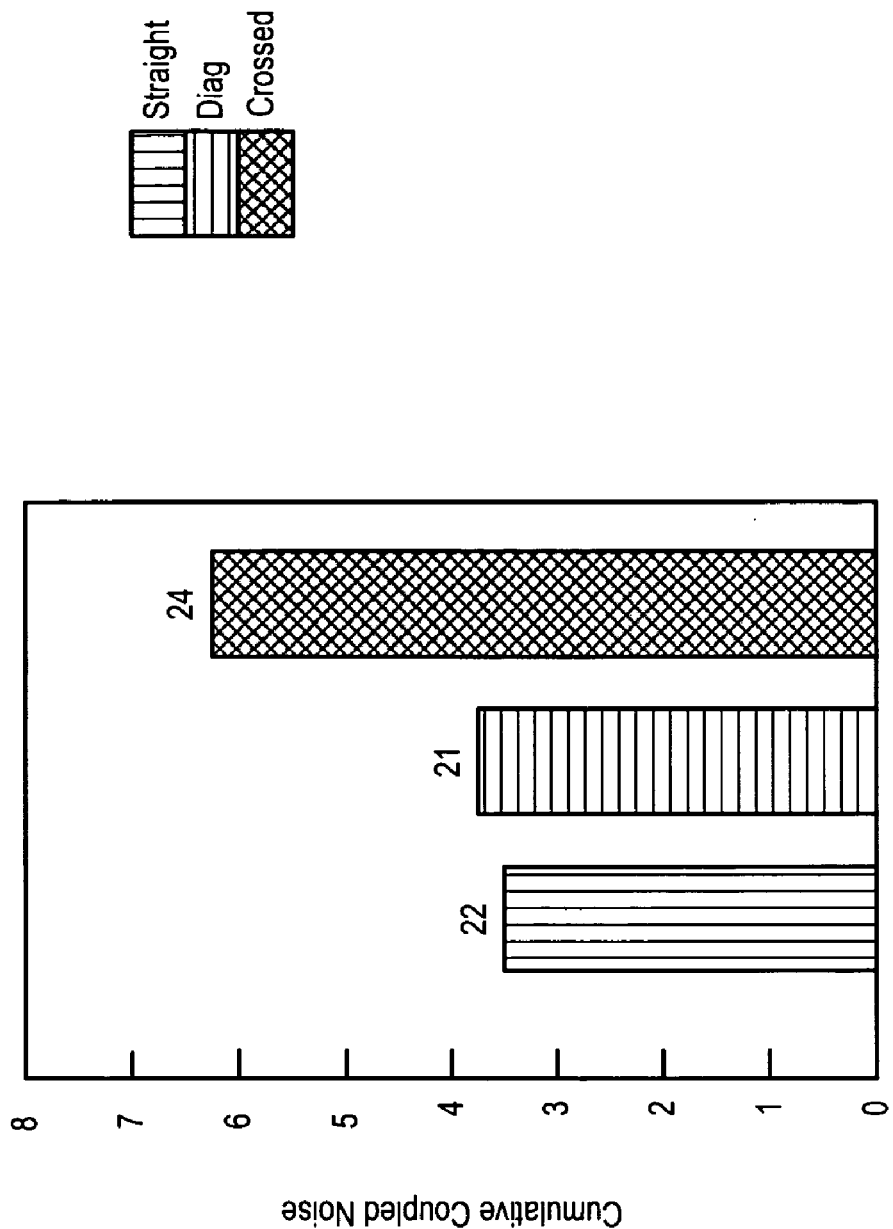
FIG. 19 shows a graph of the cumulative coupling for each 8:1:1 pin arrangement.
Figure 20A:
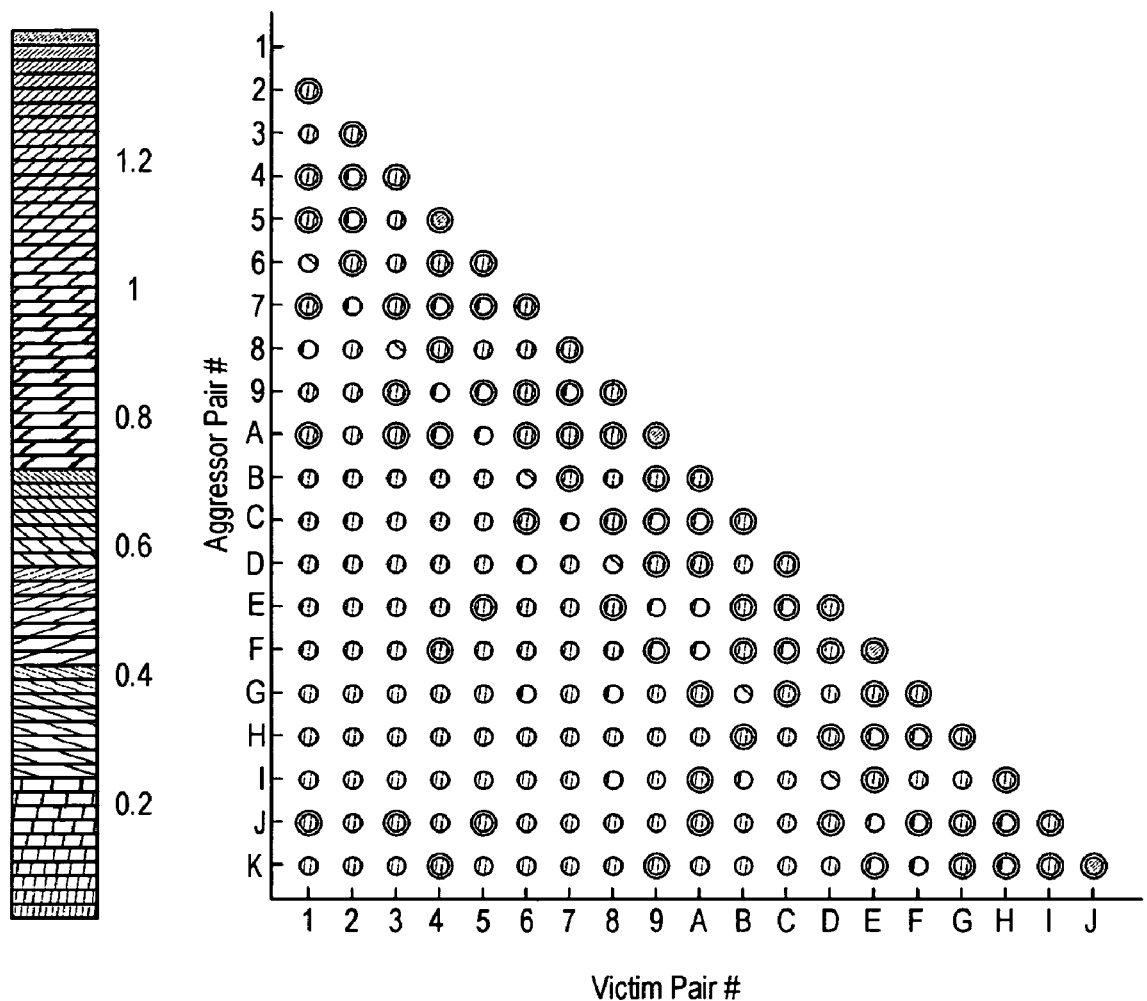
FIGS. 20A and 20B show a coupling plot and a graph of the cumulative coupling analysis for a straight 6:1:1 pin arrangement.
Figure 20B:
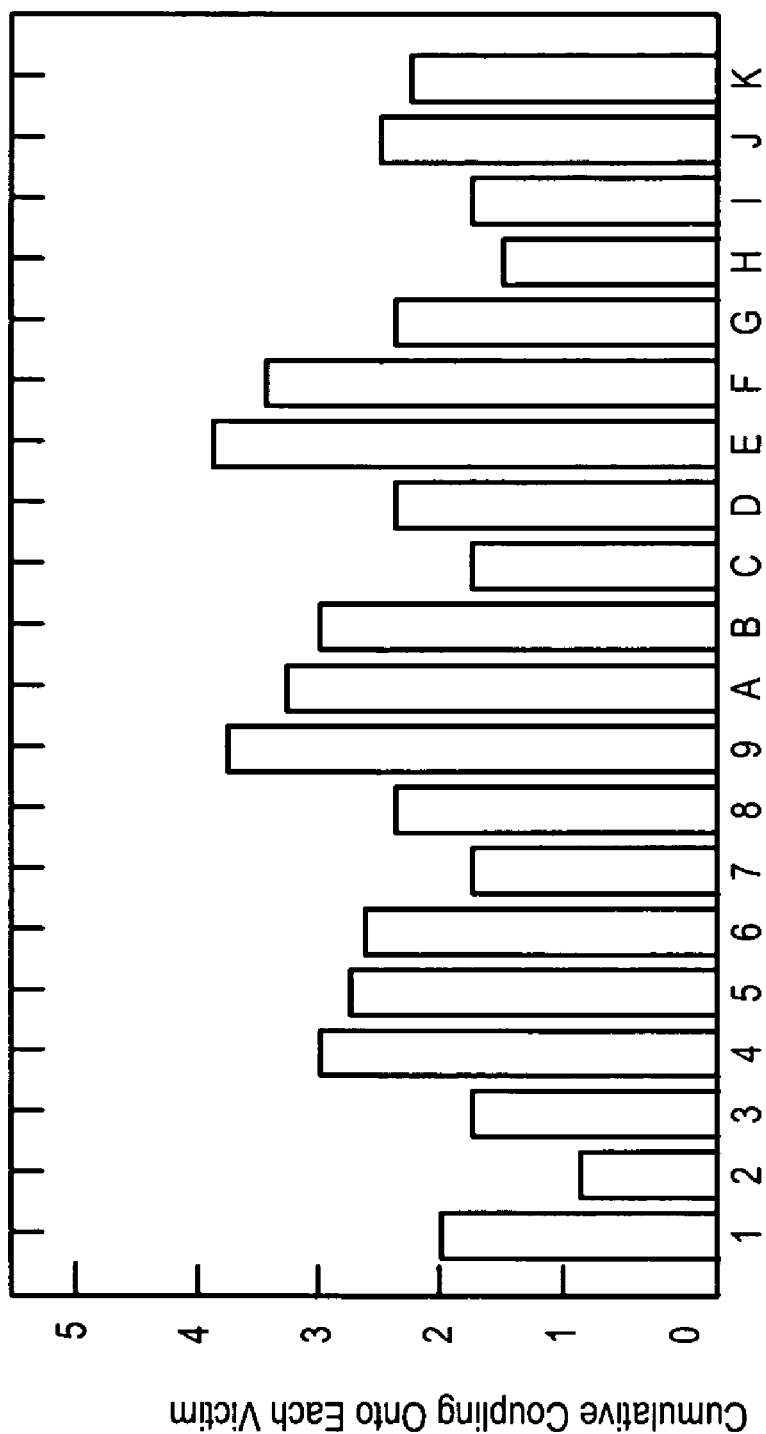
Figure 21A:
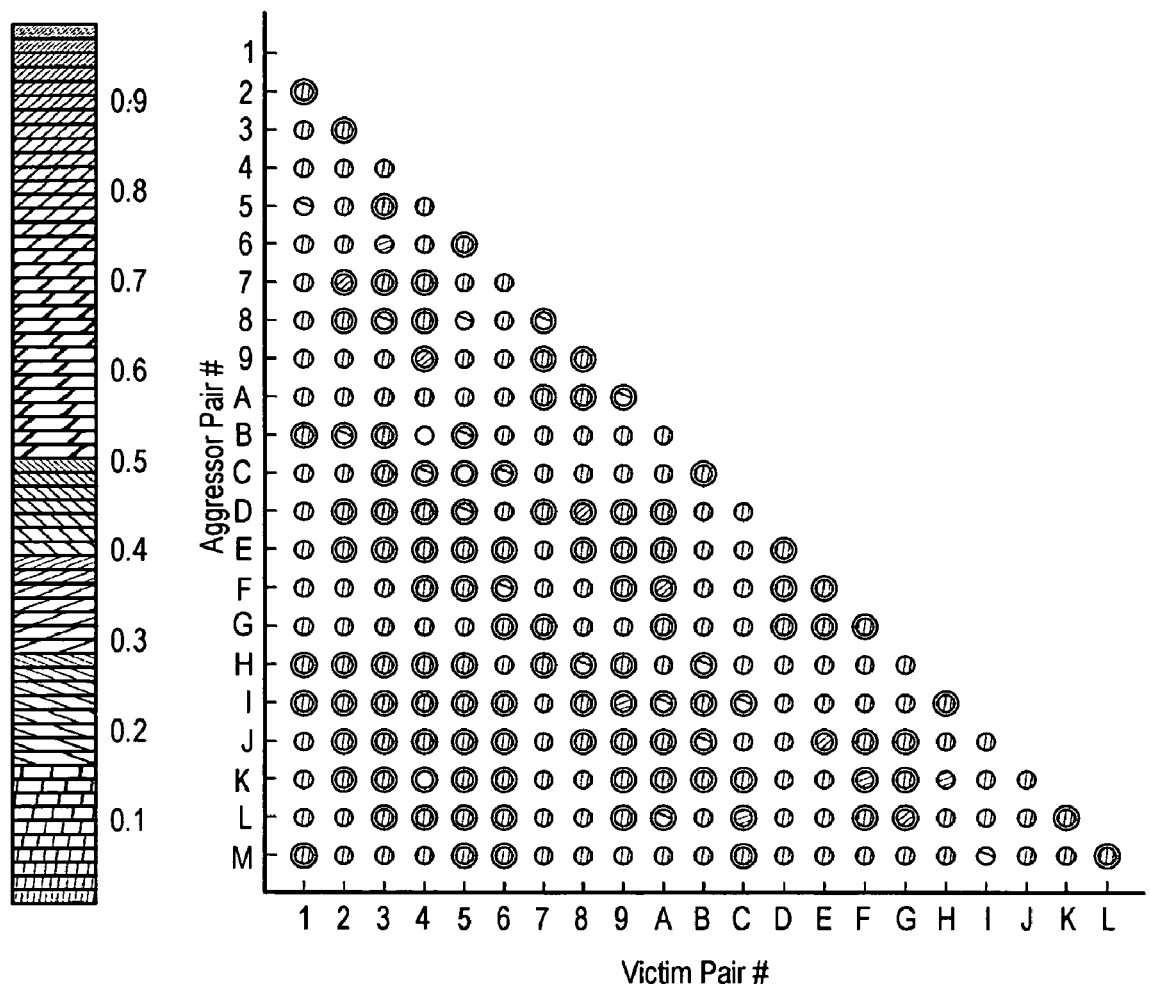
FIGS. 21A and 21B show a coupling plot and a graph of the cumulative coupling analysis for a diagonal 6:1:1 pin arrangement.
Figure 21B:
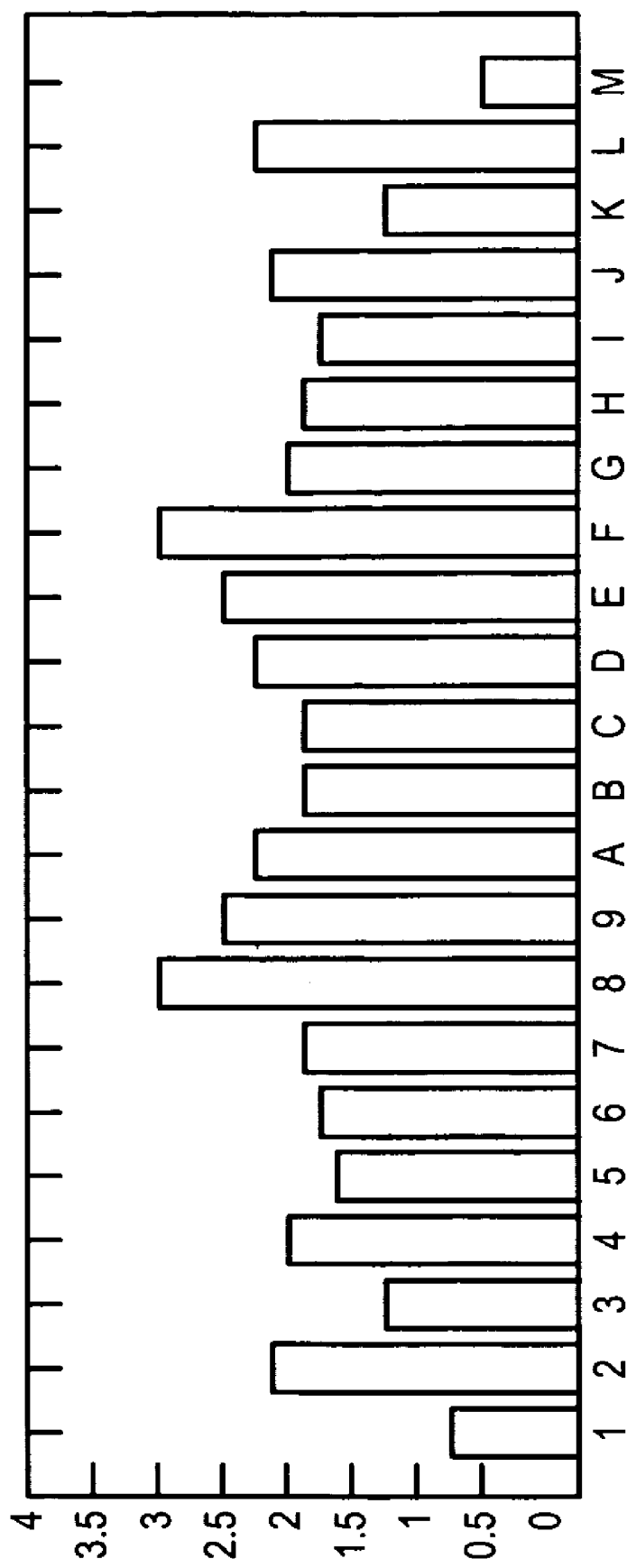
Figure 22A:
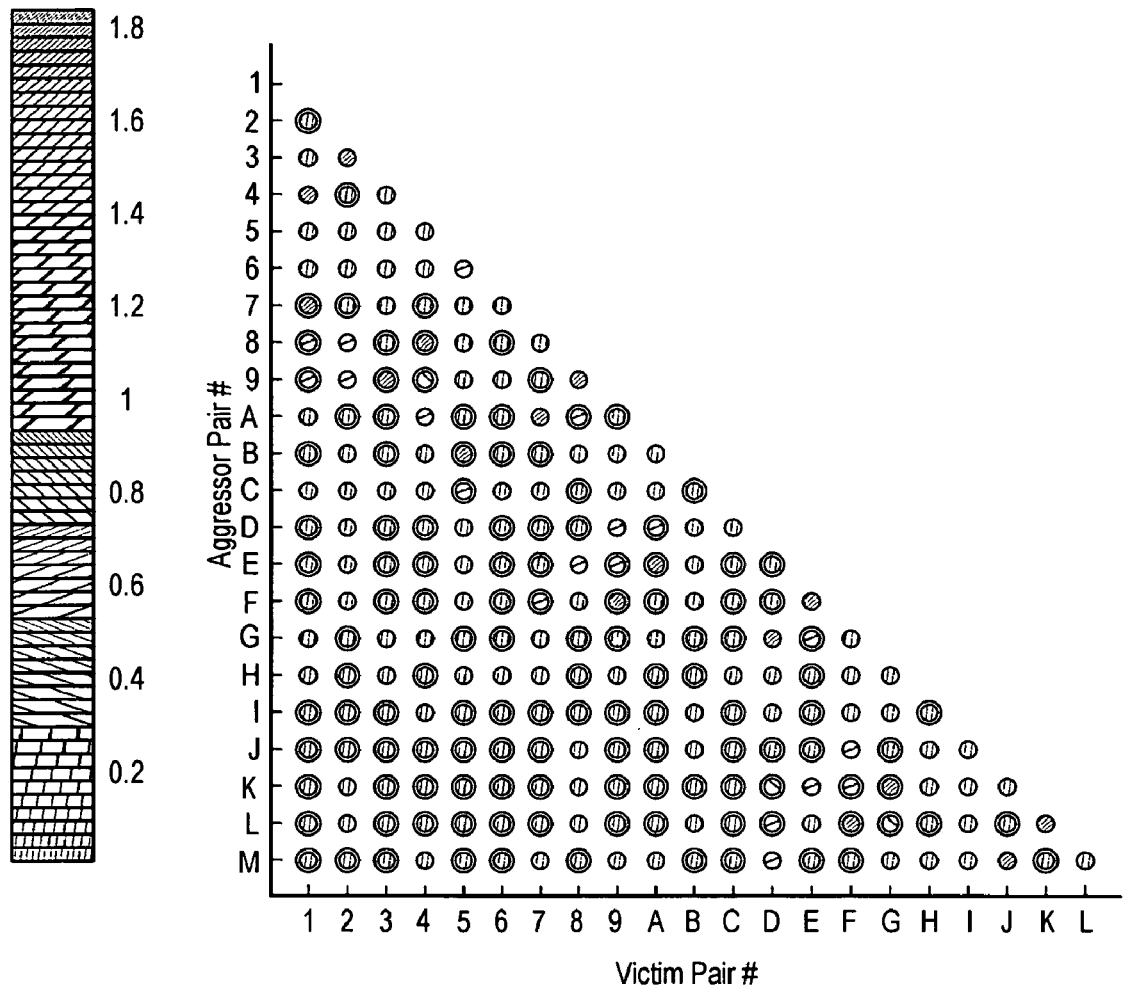
FIGS. 22A and 22B show a coupling plot and a graph of the cumulative coupling analysis for an alternative straight 6:1:1 pin arrangement.
Figure 22B:
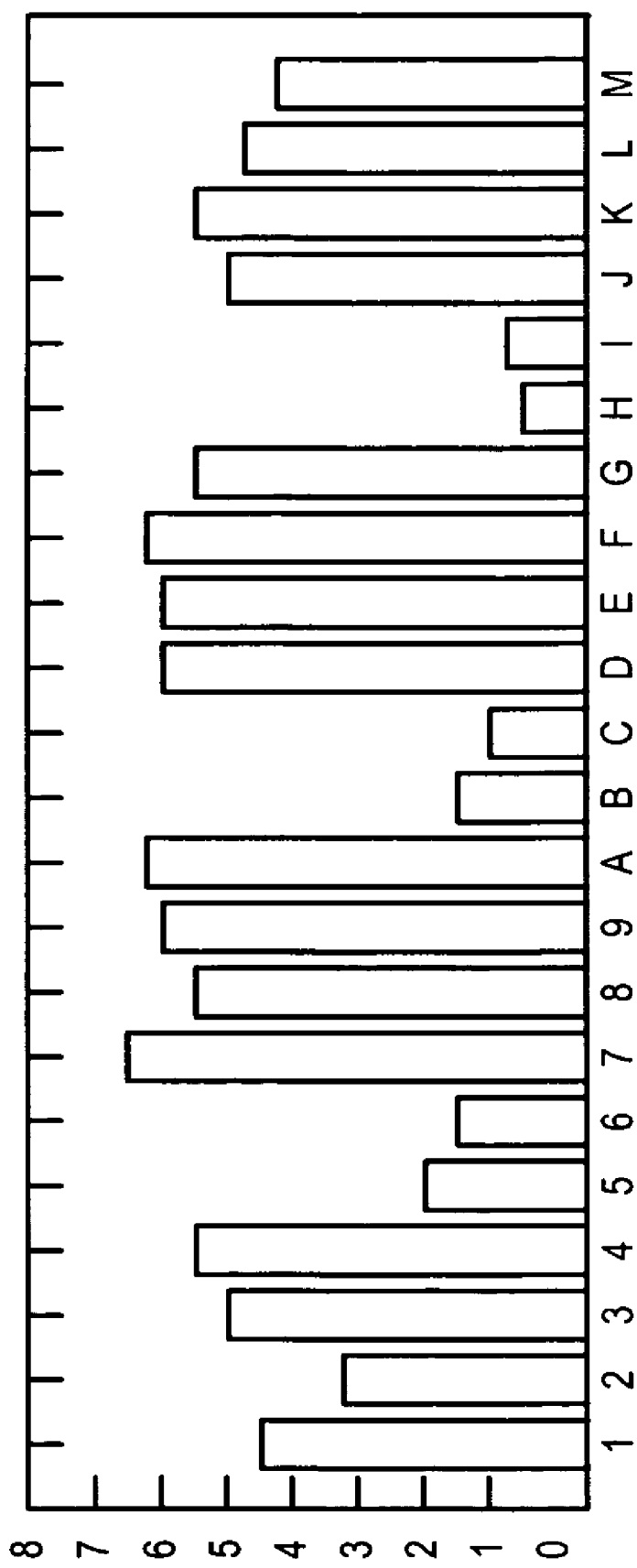
Figure 23A:
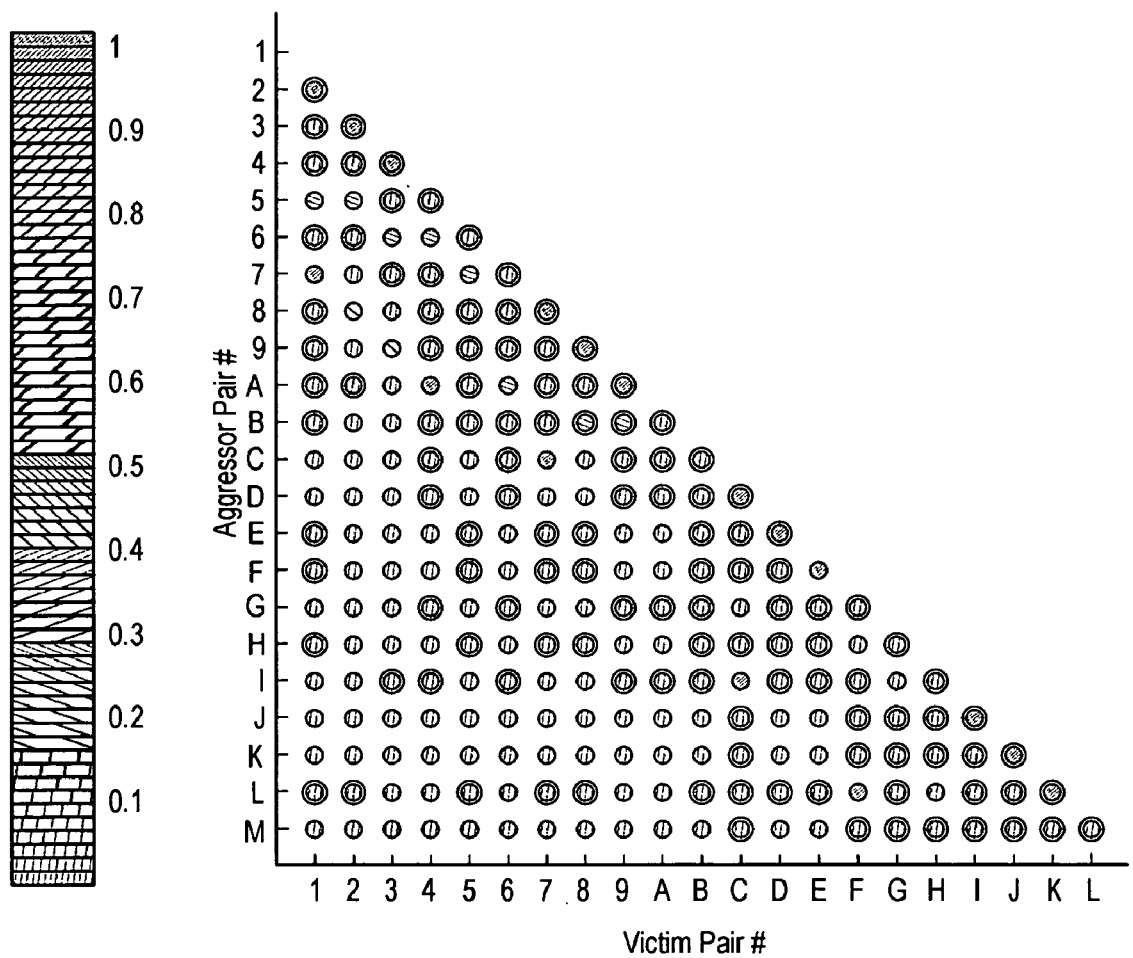
FIGS. 23A and 23B show a coupling plot and a graph of the cumulative coupling analysis for an alternative straight 6:1:1 pin arrangement.
Figure 23B:
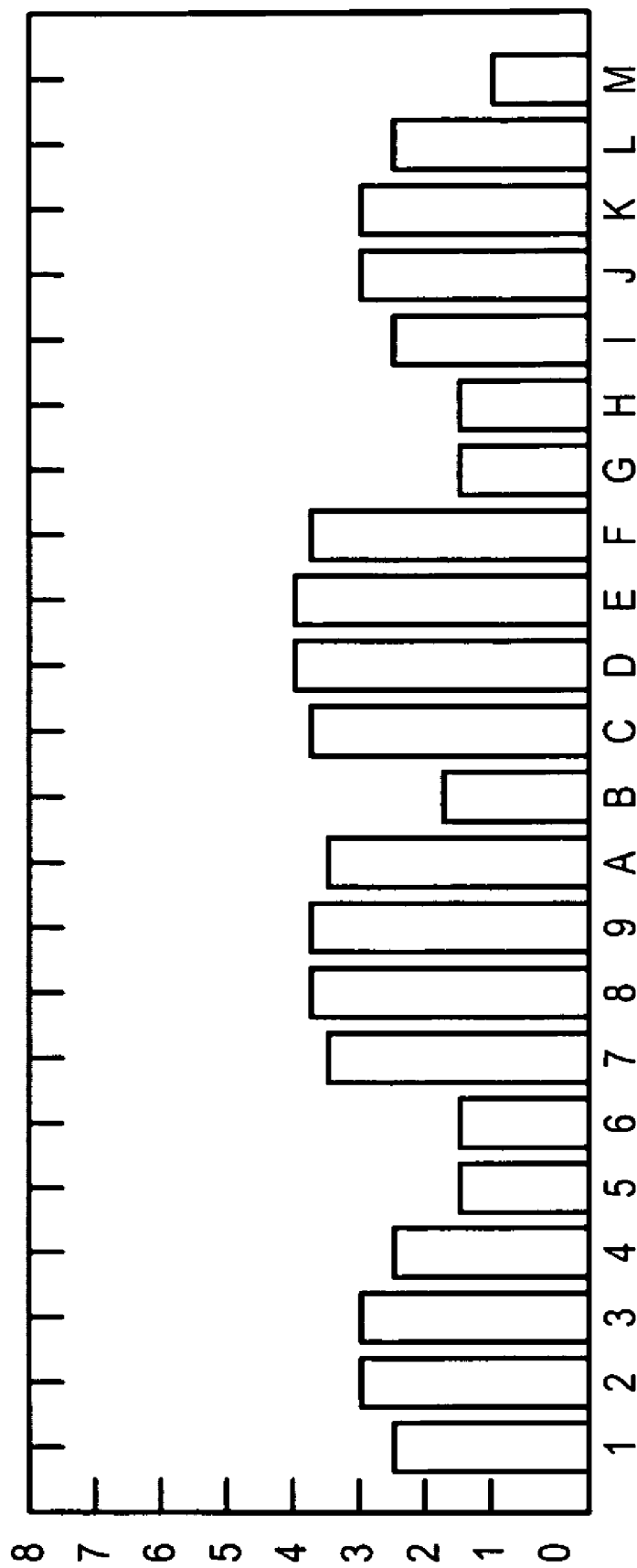

Referring to FIG. 19, a graph of the cumulative coupling for each 8:1:1 pin arrangement is shown. In the graph, the bar represents a maximum cumulative coupling observed within each of the arrangements. The number above the bar represents the number of loops within each respective pin arrangement. With the 8:1:1 pin arrangements, the crossed pin arrangement shows significantly higher coupling than the straight or diagonal pin arrangements.

FIGS. 20, 21, 22 and 23 show the coupling plot and graph of cumulative coupling analysis for the 6:1:1 pin arrangements set forth in FIGS. 5A, 5B, 5C and 5D, respectively. More specifically, referring to FIGS. 20A and 20B, a coupling plot and a graph of the cumulative coupling analysis for a straight 6:1:1 pin arrangement are shown. Referring to FIGS. 21A and 21B, a coupling plot and a graph of the cumulative coupling analysis for a diagonal 6:1:1 pin arrangement are shown. Referring to FIGS. 22A and 22B, a coupling plot and a graph of the cumulative coupling analysis for a crossed 6:1:1 pin arrangement are shown. Referring to FIGS. 23A and 23B, a coupling plot and a graph of the cumulative coupling analysis for an alternative straight 6:1:1 pin arrangement are shown.

Figure 24:
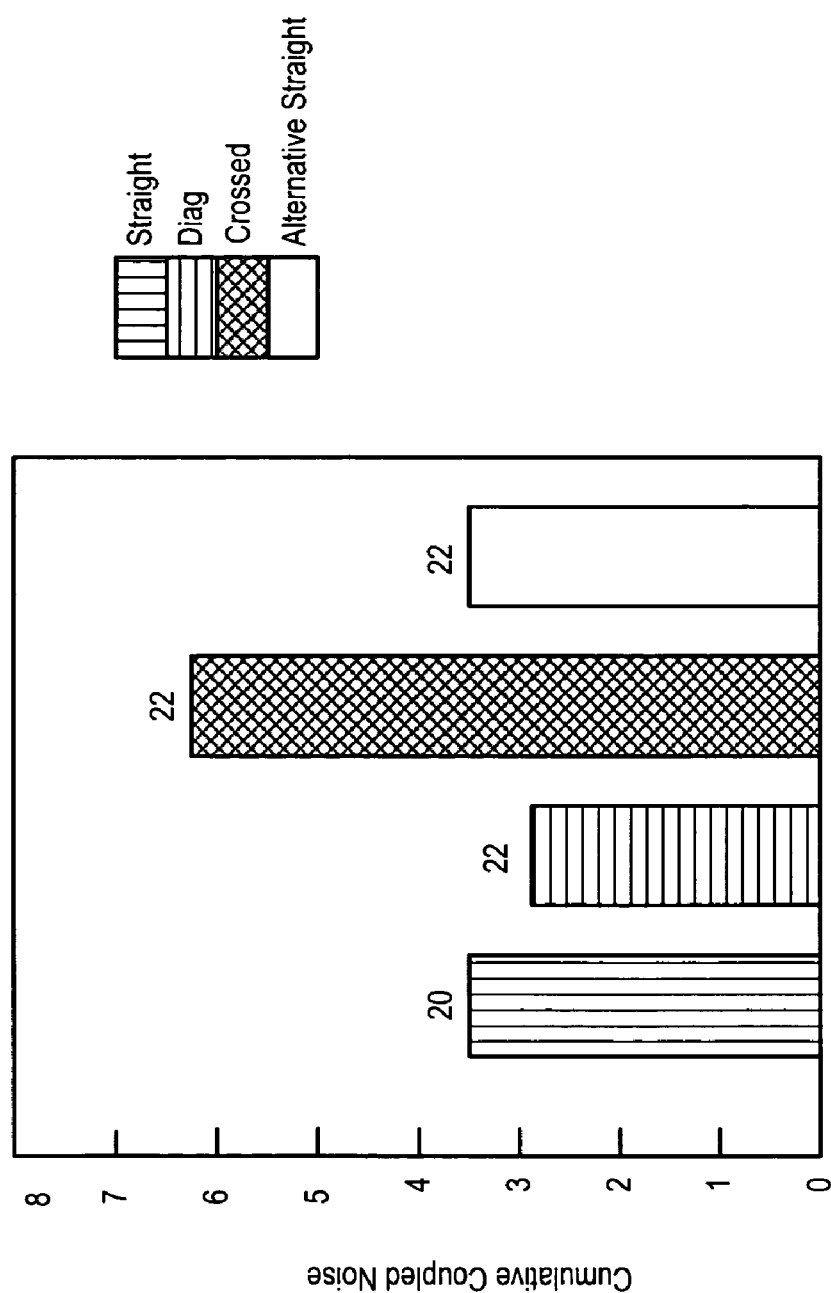
FIG. 24 shows a graph of the cumulative coupling for each 6:1:1 pin arrangement.
Figure 25A:
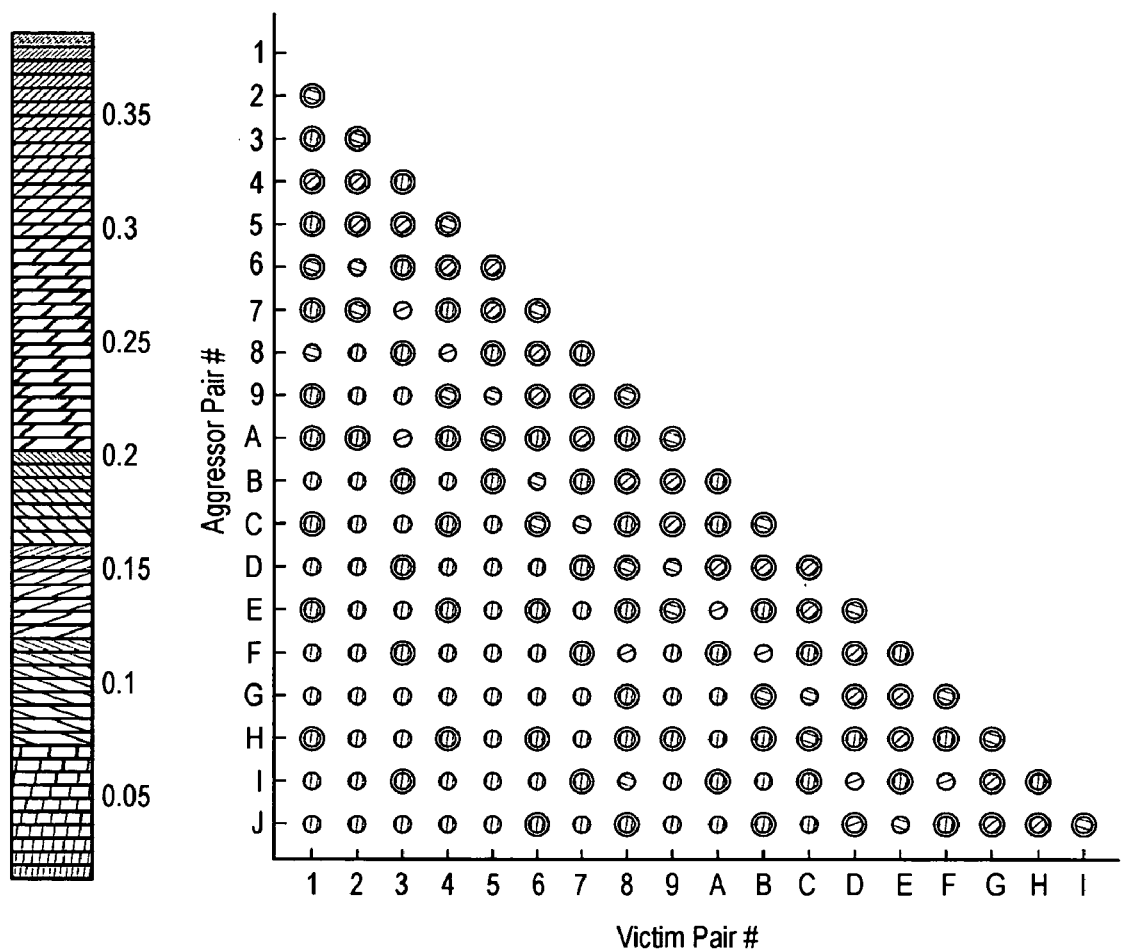
FIGS. 25A and 25B show a coupling plot and a graph of the cumulative coupling analysis for a straight 4:1:1 pin arrangement.
Figure 25B:
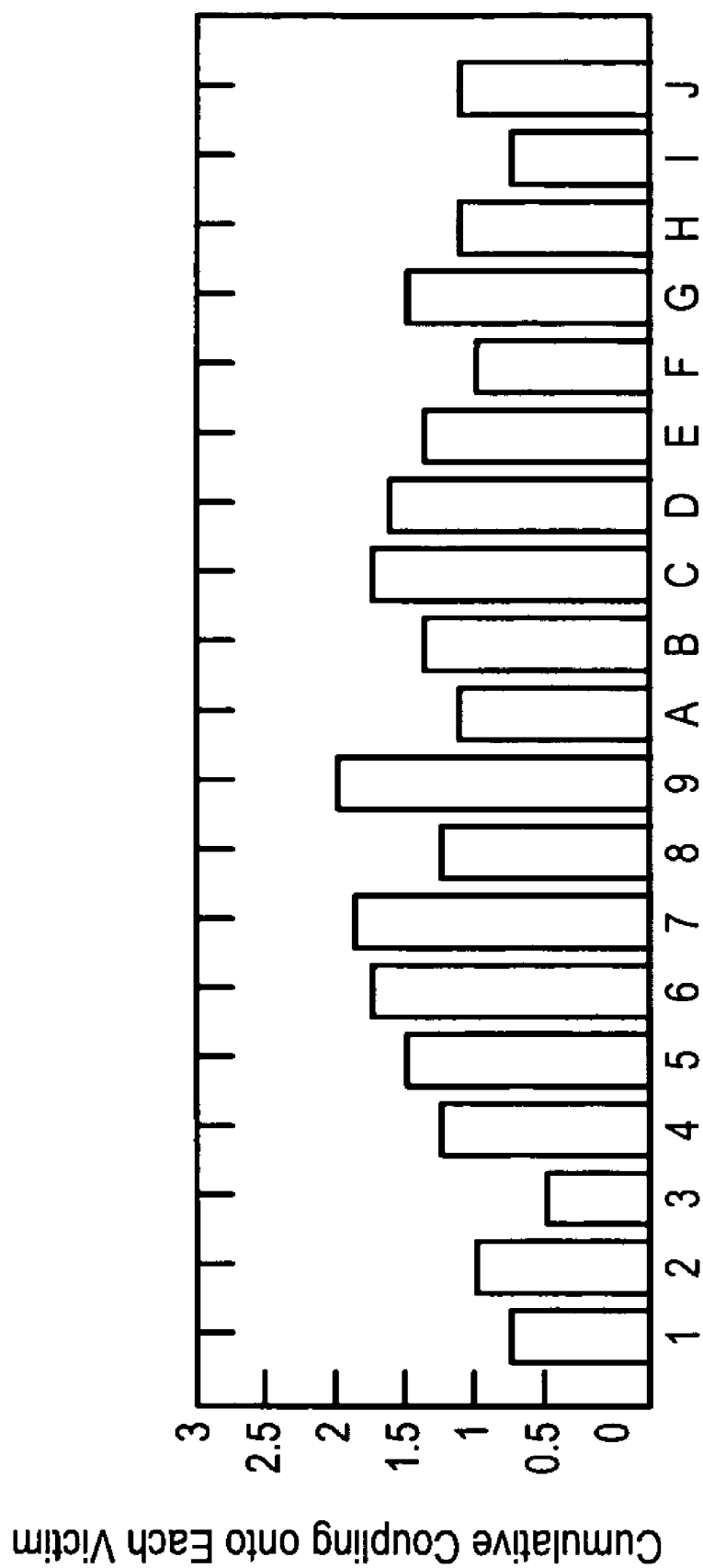
Figure 26A:
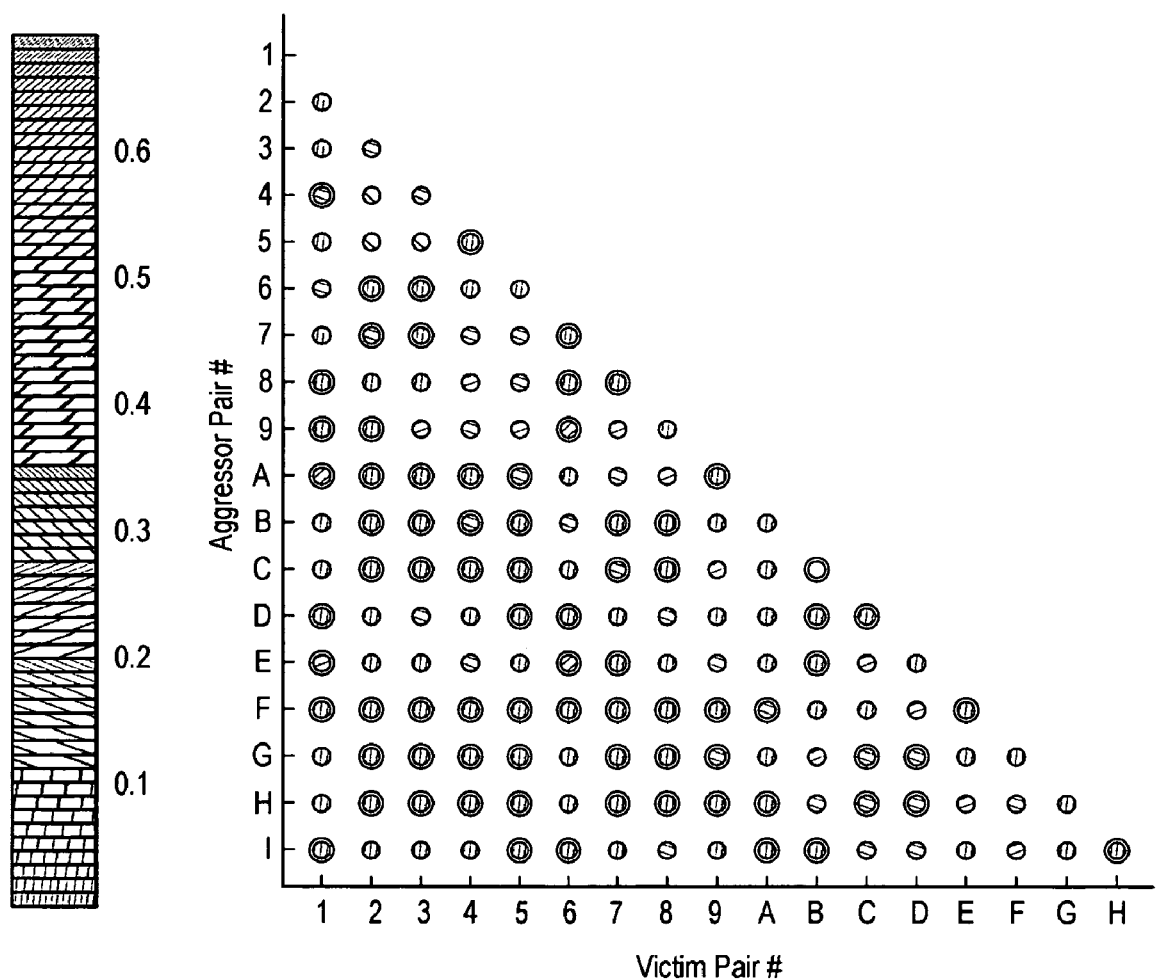
FIGS. 26A and 26B show a coupling plot and a graph of the cumulative coupling analysis for a diagonal 4:1:1 pin arrangement.
Figure 26B:
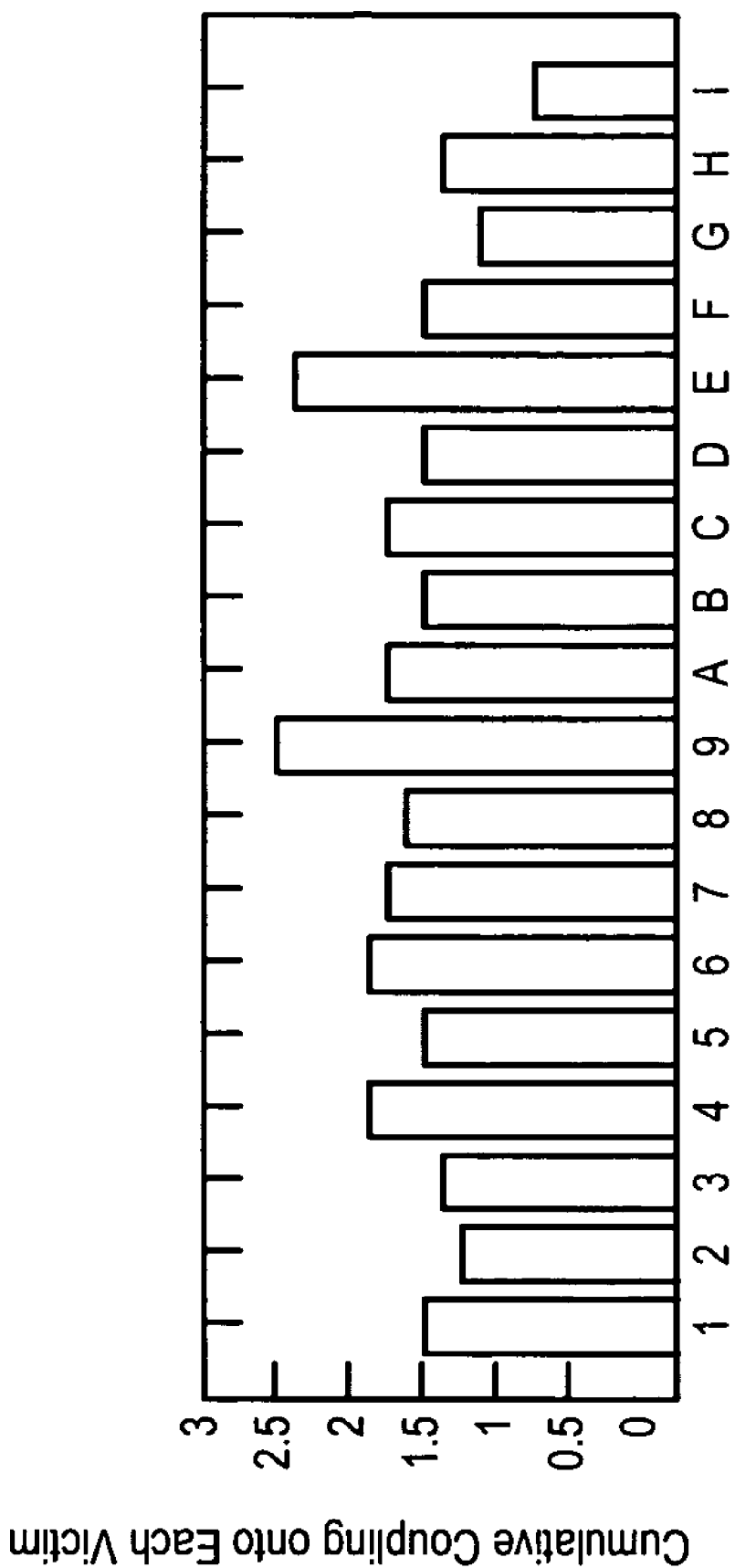
Figure 27A:
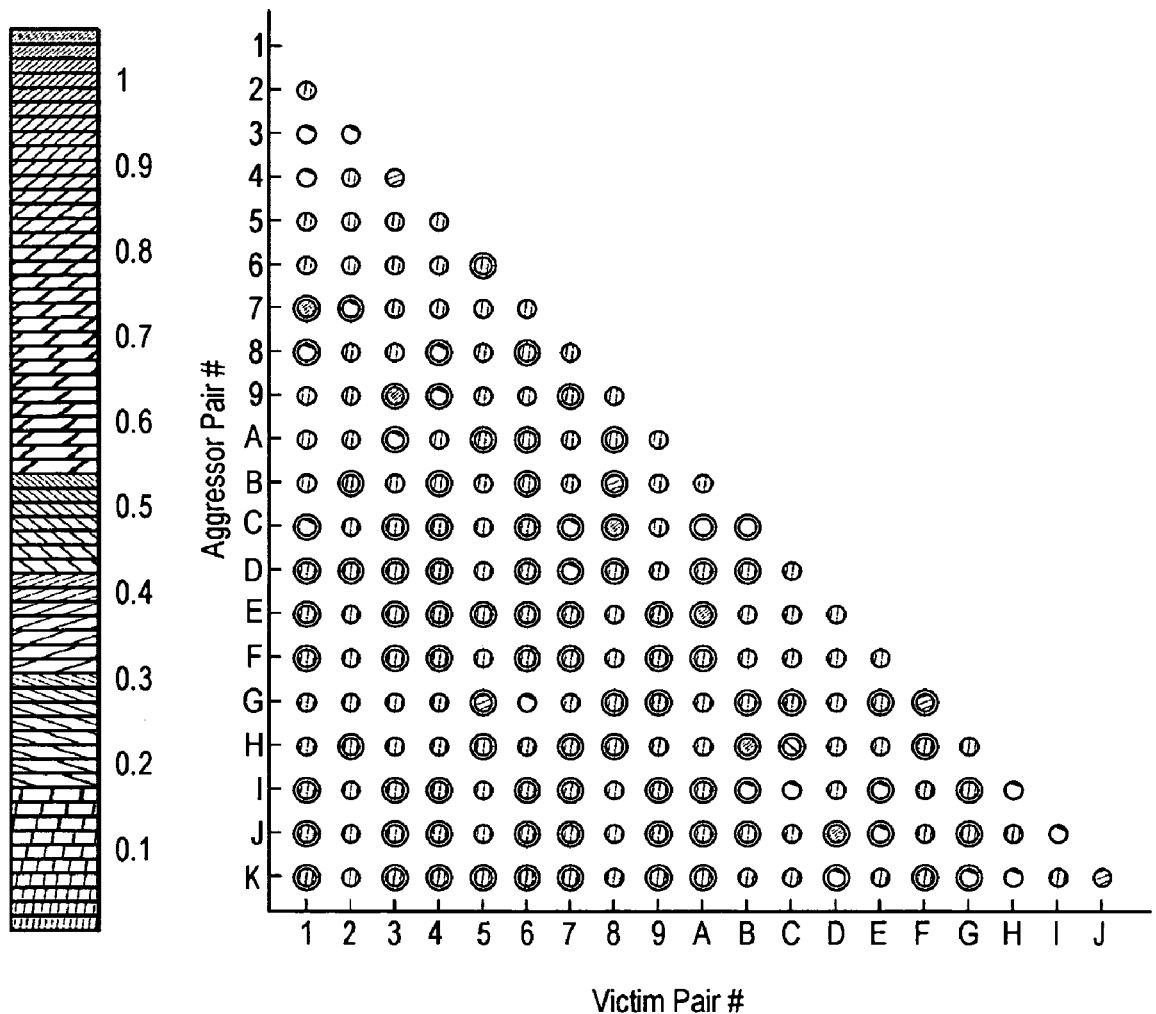
FIGS. 27A and 27B show a coupling plot and a graph of the cumulative coupling analysis for a crossed 4:1:1 pin arrangement.
Figure 27B:
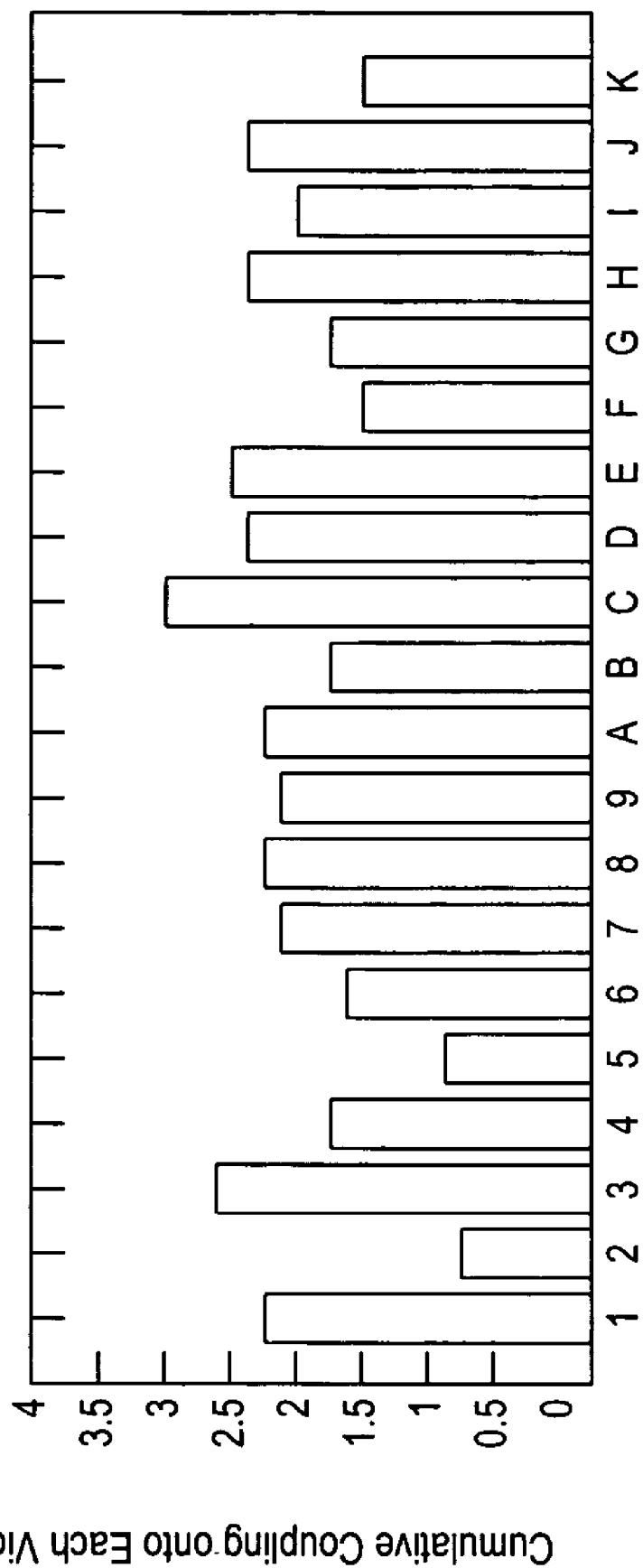
Figure 28A:
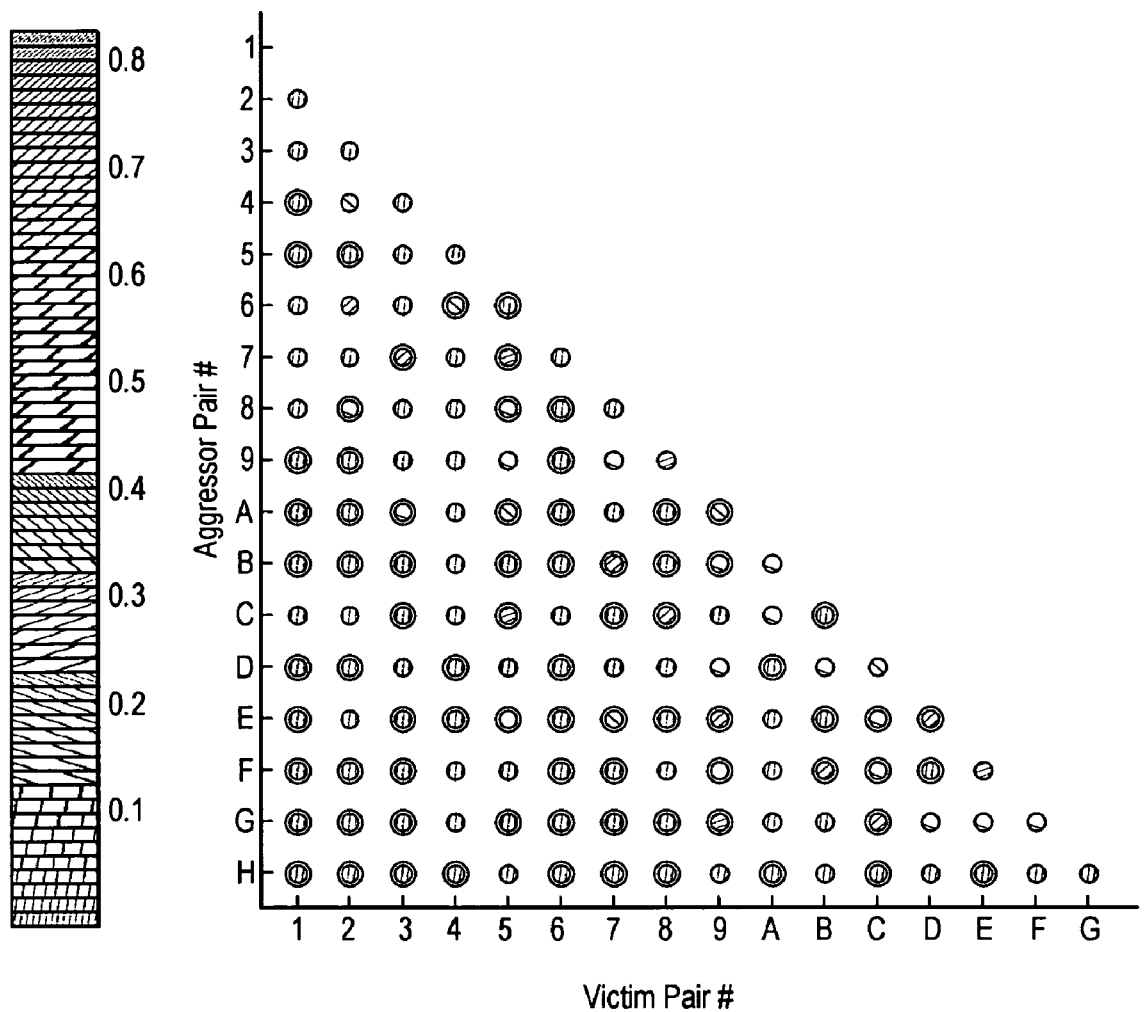
FIGS. 28A and 28B show a coupling plot and a graph of the cumulative coupling analysis for an alternative diagonal 4:1:1 pin arrangement.
Figure 28B:
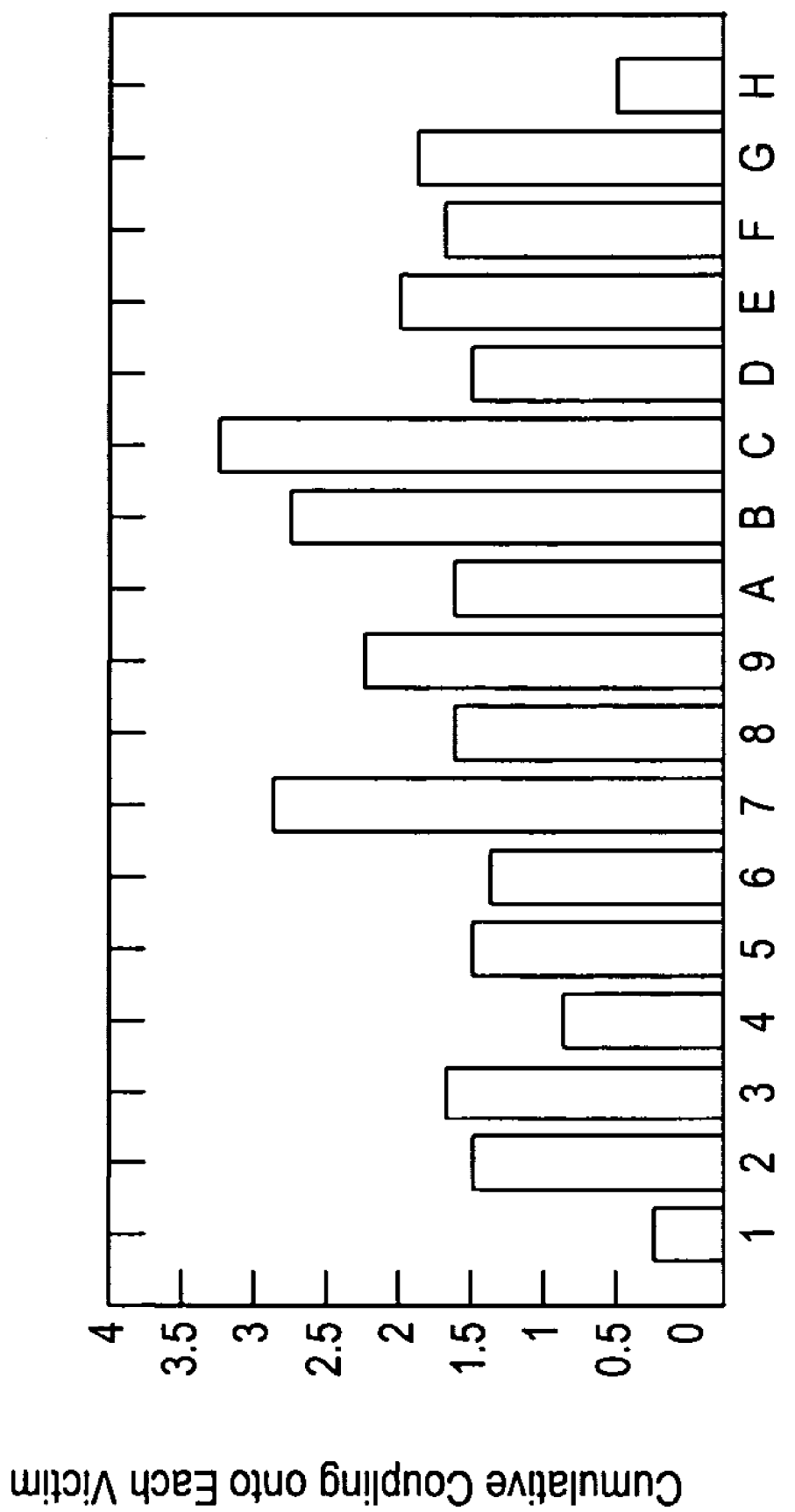

Referring to FIG. 24, a graph of the cumulative coupling for each 6:1:1 pin arrangement is shown. In the graph, the bar represents a maximum cumulative coupling observed within each of the arrangements. The number above the bar represents the number of loops within each respective pin arrangement. With the 6:1:1 pin arrangements, the crossed pin arrangement shows significantly higher coupling than the straight, diagonal or alternative straight pin arrangements.

FIGS. 25, 26, 27 and 28 show the coupling plot and graph of the cumulative coupling analysis for the 4:1:1 pin arrangements set forth in FIGS. 6A, 6B, 6C and 6D, respectively. More specifically, referring to FIGS. 25A and 25B, a coupling plot and a graph of the cumulative coupling analysis for a straight 4:1:1 pin arrangement are shown. Referring to FIGS. 26A and 26B, a coupling plot and a graph of the cumulative coupling analysis for a diagonal 4:1:1 pin arrangement are shown. Referring to FIGS. 27A and 27B, a coupling plot and a graph of the cumulative coupling analysis for a crossed 4:1:1 pin arrangement are shown. Referring to FIGS. 28A and 28B, a coupling plot and a graph of the cumulative coupling analysis for an alternative diagonal 4:1:1 pin arrangement are shown.

Figure 29:
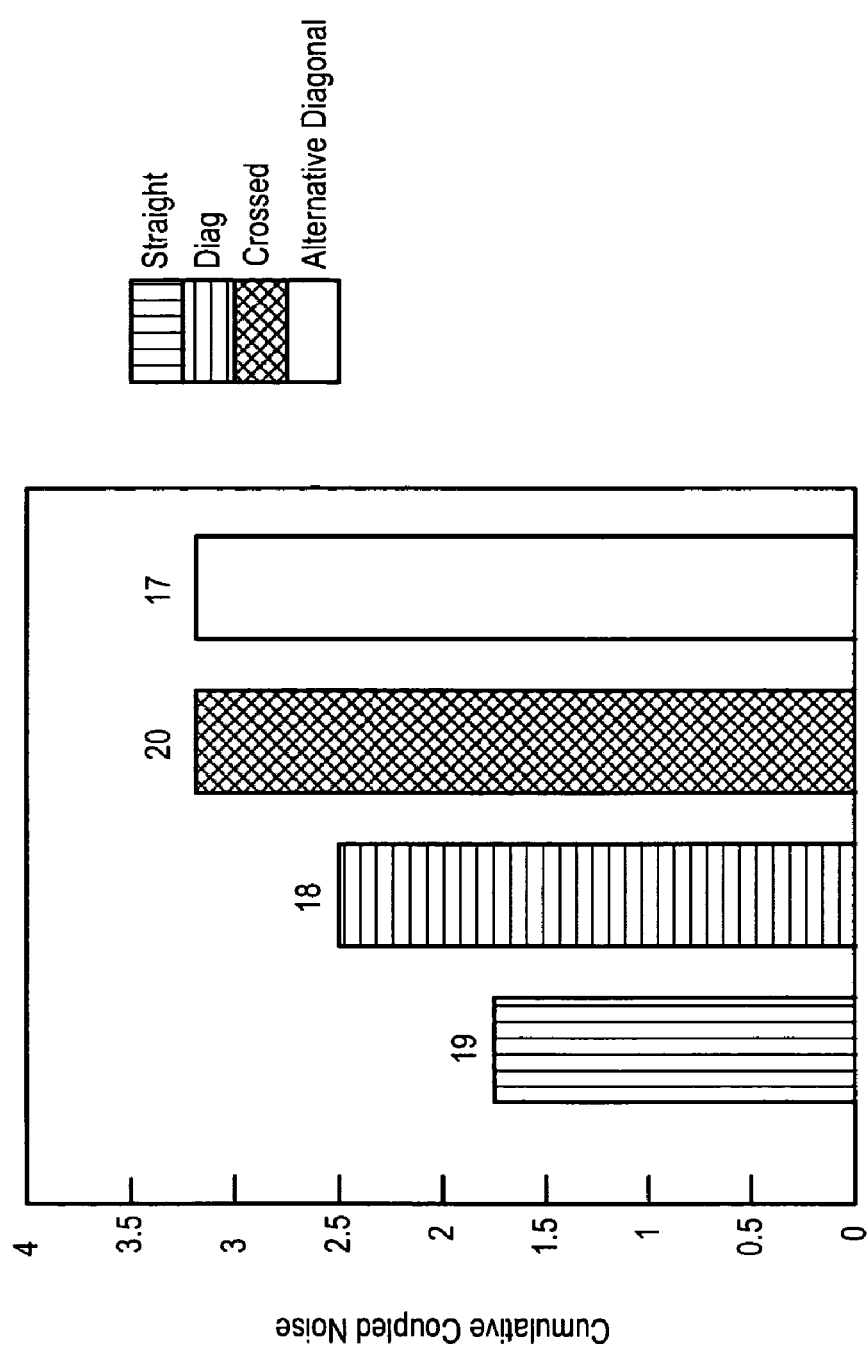
FIG. 29 shows a graph of the cumulative coupling for each 4:1:1 pin arrangement.

Referring to FIG. 29, a graph of the cumulative coupling for each 4:1: pin arrangement is shown. In the graph, the bar represents a maximum cumulative coupling observed with each of the arrangements. The number above the bar represents the number of loops within each respective pin arrangement. With the 4:1:1 pin arrangements, the crossed pin arrangement and the alternative diagonal pin arrangement show significantly higher coupling than the straight or diagonal pin arrangements.

Figure 30:
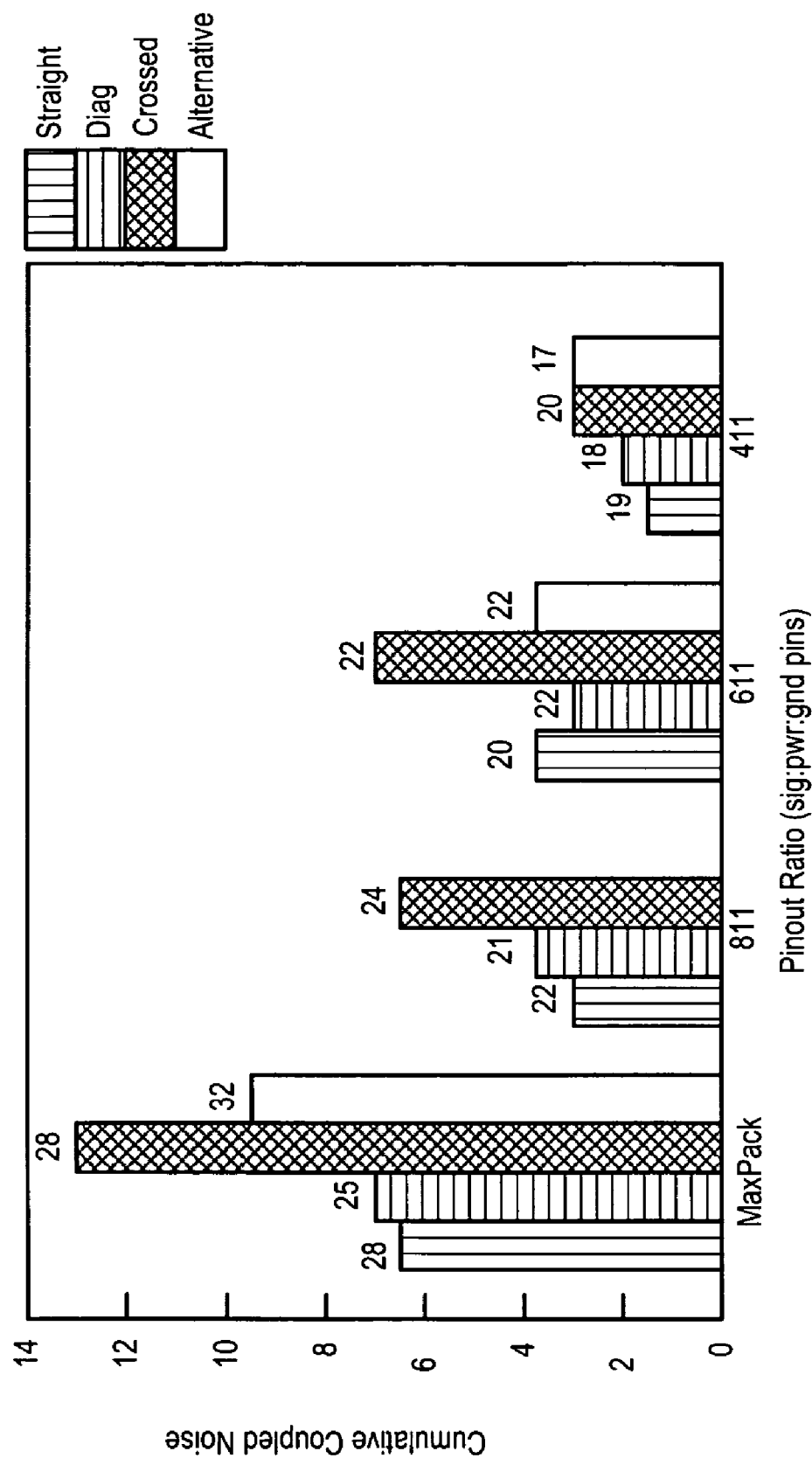
FIG. 30 shows a graph of the cumulative coupling analysis for all simulated pin arrangements.

Referring to FIG. 30, a graph of the cumulative coupling analysis for all simulated pin arrangements is shown. More specifically, it can be determined from the graphs that the crossed arrangement generally produced the highest coupled noise. Additionally, the alternate pin arrangements generally produced higher coupled noise than the straight or diagonal pin arrangements. The straight and diagonal pin arrangements produced substantially similar performance. Accordingly, one of these two arrangements might be chosen based upon the routability of the arrangement.

Other Embodiments

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

For example, while 8×8 arrays were analyzed, it will be appreciated that any size array might be used. Also, for example, it will be appreciated that while many pin arrangements were set forth, additional pin arrangements may be configured and tested. These pin arrangements might vary the number of power and ground pins as well as the location of the pins with respect to the differential pairs. Additionally, the arrangements might provide additional variations on the placement of the differential pairs.

For example, the above-discussed embodiments include modules that perform certain tasks. The modules discussed herein may include hardware modules or software modules. The hardware modules may be implemented within application specific circuitry or via some form of programmable logic device. The software modules may include script, batch, or other executable files. The modules may be stored on a machine-readable or computer-readable storage medium such as a disk drive. Storage devices used for storing software modules in accordance with an embodiment of the invention may be magnetic floppy disks, hard disks, or optical disks such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computer-readable storage media may be used to store the modules discussed herein. Additionally, those skilled in the art will recognize that the separation of functionality into modules is for illustrative purposes. Alternative embodiments may merge the functionality of multiple modules into a single module or may impose an alternate decomposition of functionality of modules. For example, a software module for calling sub-modules may be decomposed so that each sub-module performs its function and passes control directly to another sub-module.

Consequently, the invention is intended to be limited only by the spirit and scope of the appended claims, giving full cognizance to equivalents in all respects.

What is claimed is:

1. A method for analyzing input output (I/O) pin arrangements to determine the effect of differential pair and power and ground pin placement on signal quality comprising:
   constructing an array of pins;
   arranging a plurality of differential pairs within the array of pins to provide a pin arrangement;
   exciting each of the differential pairs within the pin arrangement;
   monitoring coupled noise on other differential pairs within the pin arrangement;
   analyzing the pin arrangement based upon the monitoring, the analyzing the pin arrangement including
     generating a coupling plot based upon the monitoring; and
     determining cumulative coupling based upon the coupling plot.

2. The method of claim 1 wherein the pin arrangement includes:
   maximally packed differential pairs.

3. The method of claim 1 wherein the pin arrangement includes:
power and ground pins as well as differential pairs.

4. The method of claim 3 wherein:
the differential pairs, power pins and ground pins are arranged according to a ratio of eight differential pairs per one power pin and one ground pin.

5. The method of claim 3 wherein the pin arrangement includes:
the differential pairs, power pins and ground pins are arranged according to a ratio of six different pairs per one power pin and one ground pin.

6. The method of claim 3 wherein the pin arrangement includes:
the differential pairs, power pins and ground pins are arranged according to a ratio of four differential pairs per one power pin and one ground pin.

7. An apparatus for analyzing input output (I/O) pin arrangements to determine the effect of differential pair and power and ground pin placement on signal quality comprising:
means for constructing an array of pins;
means for arranging a plurality of differential pairs within the array of pins to provide a pin arrangement;
means for exciting each of the differential pairs within the pin arrangement;
means for monitoring coupled noise on other differential pairs within the pin arrangement;
means for analyzing the pin arrangement based upon the monitoring, the means for analyzing the pin arrangement including
means for generating a coupling plot based upon the monitoring; and
means for determining cumulative coupling based upon the coupling plot.

8. The apparatus of claim 7 wherein the pin arrangement includes:
maximally packed differential pairs.

9. The apparatus of claim 7 wherein the pin arrangement includes:
power and ground pins as well as differential pairs.

10. The apparatus of claim 9 wherein:
the differential pairs, power pins and ground pins are arranged according to a ratio of eight differential pairs per one power pin and one ground pin.

11. The apparatus of claim 9 wherein the pin arrangement includes:
the differential pairs, power pins and ground pins are arranged according to a ratio of six different pairs per one power pin and one ground pin.

12. The apparatus of claim 9 wherein the pin arrangement includes:
the differential pairs, power pins and ground pins are arranged according to a ratio of four differential pairs per one power pin and one ground pin.

13. An apparatus comprising:
a processor;
a memory coupled to the processor; and
a system for analyzing input output (I/O) pin arrangements to determine the effect of differential pair and power and ground pin placement on signal quality, the system being stored on the memory and executing on the processor, the system including
a constructing module, the constructing module constructing an array of pins;
an arranging module, the arranging module arranging a plurality of differential pairs within the array of pins to provide a pin arrangement;
an exciting module, the exciting module exciting each of the differential pairs within the pin arrangement;
a monitoring module, the monitoring module monitoring coupled noise on other differential pairs within the pin arrangement; and,
an analyzing module, the analyzing module analyzing the pin arrangement based upon the monitoring the analyzing module including
a generating module, the generating module generating a coupling plot based upon the monitoring; and
a determining module, the determining module determining cumulative coupling based upon the coupling plot.

14. The apparatus of claim 13 wherein the pin arrangement includes:
maximally packed differential pairs.

15. The apparatus of claim 13 wherein the pin arrangement includes:
power and ground pins as well as differential pairs.

16. The apparatus of claim 15 wherein:
the differential pairs, power pins and ground pins are arranged according to a ratio of eight differential pairs per one power pin and one ground pin.

17. The apparatus of claim 15 wherein the pin arrangement includes:
the differential pairs, power pins and ground pins are arranged according to a ratio of six different pairs per one power pin and one ground pin.

18. The apparatus of claim 15 wherein the pin arrangement includes:
the differential pairs, power pins and ground pins are arranged according to a ratio of four differential pairs per one power pin and one ground pin.

* * * * *